(12) United States Patent
Finn

(10) Patent No.: US 7,980,477 B2
(45) Date of Patent: Jul. 19, 2011

(54) DUAL INTERFACE INLAYS

(75) Inventor: David Finn, Lower Churchfield (IE)

(73) Assignee: Féinics Amatech Teoranta, Lower Churchfield, Tourmakeady, County Mayo (IE)

( * ) Notice: Subject to any disclaimer, the term of this patent is extended or adjusted under 35 U.S.C. 154(b) by 506 days.

(21) Appl. No.: 12/117,748

(22) Filed: May 9, 2008

(65) Prior Publication Data

US 2008/0283615 A1    Nov. 20, 2008

Related U.S. Application Data

(60) Provisional application No. 60/938,454, filed on May 17, 2007.

(51) Int. Cl.
| | |
|---|---|
| G06K 19/06 | (2006.01) |
| H01Q 1/40 | (2006.01) |
| H01Q 1/36 | (2006.01) |
| G08B 13/14 | (2006.01) |

(52) U.S. Cl. ........ 235/492; 235/488; 343/873; 343/895; 340/572.7; 29/600

(58) Field of Classification Search .................. 235/487, 235/488, 492; 340/572.1, 572.7; 343/895, 343/700 MS, 873, 866, 870; 29/600
See application file for complete search history.

(56) References Cited

U.S. PATENT DOCUMENTS

| | | |
|---|---|---|
| 3,674,914 A | 7/1972 | Burr |
| 4,437,603 A | 3/1984 | Kobayashi et al. |
| 4,463,971 A * | 8/1984 | Hoppe et al. ..................... 283/83 |
| 4,533,787 A | 8/1985 | Anderegg et al. |
| 4,641,773 A | 2/1987 | Morino et al. |
| 4,693,778 A | 9/1987 | Swiggett et al. |
| 4,730,188 A | 3/1988 | Milheiser |
| 4,884,334 A | 12/1989 | Houser et al. |
| 4,912,143 A | 3/1990 | Ahn et al. |
| 5,041,826 A | 8/1991 | Milheiser |
| 5,083,087 A | 1/1992 | Fox et al. |
| 5,094,907 A | 3/1992 | Yamura et al. |
| 5,166,676 A | 11/1992 | Milheiser |
| 5,201,453 A | 4/1993 | Amador et al. |
| 5,211,129 A | 5/1993 | Taylor et al. |
| 5,281,855 A | 1/1994 | Hadden et al. |
| 5,340,946 A | 8/1994 | Friedrich et al. |
| 5,365,657 A | 11/1994 | Brown et al. |
| 5,491,302 A | 2/1996 | Distefano et al. |
| 5,773,812 A | 6/1998 | Kreft |

(Continued)

FOREIGN PATENT DOCUMENTS

| | | |
|---|---|---|
| CA | 2555034 | 9/2005 |

(Continued)

*Primary Examiner* — Michael G Lee
*Assistant Examiner* — Suezu Ellis
(74) *Attorney, Agent, or Firm* — Gerald E. Linden

(57) ABSTRACT

A dual interface inlay having a bottom sheet; an antenna wire mounted to the top surface of the bottom sheet; end portions of the antenna wire formed with squiggles or meanders forming contact areas of increased surface area for subsequent attachment of a chip or chip module to the antenna wire; conductive material applied to the end portions of the antenna wire; a top sheet disposed over the bottom sheet for lamination thereto; and recesses formed in a bottom surface of the top sheet, at positions corresponding to the contact area. The antenna wire may be insulated wire, and insulation may be removed from the end portions of the antenna wire. Silicon cushions may be disposed in the bottom sheet under the contact areas.

20 Claims, 12 Drawing Sheets

U.S. PATENT DOCUMENTS

| | | | |
|---|---|---|---|
| 5,809,633 A | 9/1998 | Mundigl et al. | |
| 5,847,372 A | 12/1998 | Kreft | |
| 5,969,951 A * | 10/1999 | Fischer et al. | 361/737 |
| 6,008,993 A | 12/1999 | Kreft | |
| 6,088,230 A | 7/2000 | Finn et al. | |
| 6,095,423 A | 8/2000 | Houdeau et al. | |
| 6,095,915 A | 8/2000 | Geissler | |
| 6,107,920 A | 8/2000 | Eberhardt et al. | |
| 6,140,707 A | 10/2000 | Plepys et al. | |
| 6,142,381 A | 11/2000 | Finn et al. | |
| 6,152,348 A | 11/2000 | Finn et al. | |
| 6,161,761 A * | 12/2000 | Ghaem et al. | 235/492 |
| 6,190,942 B1 | 2/2001 | Wilm et al. | |
| 6,206,292 B1 | 3/2001 | Robertz et al. | |
| 6,233,818 B1 | 5/2001 | Finn et al. | |
| 6,259,369 B1 | 7/2001 | Monico | |
| 6,288,443 B1 | 9/2001 | Finn et al. | |
| 6,310,778 B1 | 10/2001 | Finn et al. | |
| 6,460,773 B1 * | 10/2002 | Kaiya et al. | 235/492 |
| 6,471,878 B1 | 10/2002 | Greene et al. | |
| 6,521,829 B2 | 2/2003 | Matsumura et al. | |
| 6,576,081 B2 * | 6/2003 | Date et al. | 156/310 |
| 6,606,247 B2 | 8/2003 | Credelle et al. | |
| 6,626,364 B2 | 9/2003 | Taban | |
| 6,628,240 B2 | 9/2003 | Amadeo | |
| 6,667,092 B1 | 12/2003 | Brollier et al. | |
| 6,677,917 B2 | 1/2004 | Van Heerden et al. | |
| 6,698,089 B2 | 3/2004 | Finn et al. | |
| 6,715,688 B2 * | 4/2004 | Kobayashi et al. | 235/492 |
| 6,870,497 B2 | 3/2005 | Kondo et al. | |
| 6,881,605 B2 * | 4/2005 | Lee et al. | 438/106 |
| 6,956,182 B2 | 10/2005 | Gregory | |
| 7,011,980 B1 | 3/2006 | Na et al. | |
| 7,176,053 B1 | 2/2007 | Dimmler | |
| 7,626,548 B2 * | 12/2009 | Matsushita et al. | 343/700 MS |
| 7,663,564 B2 * | 2/2010 | Ayala et al. | 343/741 |
| 2002/0020903 A1 | 2/2002 | Kreft et al. | |
| 2004/0089707 A1 | 5/2004 | Cortina et al. | |
| 2004/0155114 A1 | 8/2004 | Rietzler | |
| 2005/0206524 A1 | 9/2005 | Forster et al. | |
| 2005/0282355 A1 | 12/2005 | Edwards et al. | |
| 2005/0282495 A1 | 12/2005 | Forster | |
| 2006/0114109 A1 | 6/2006 | Geissler | |
| 2007/0130754 A1 | 6/2007 | Fein | |
| 2007/0290051 A1 | 12/2007 | Bielmann et al. | |
| 2008/0143535 A1 * | 6/2008 | Fischer | 340/572.7 |

FOREIGN PATENT DOCUMENTS

| | | | |
|---|---|---|---|
| DE | 28 11 458 | 2/1979 | |
| DE | 36 22 246 | 1/1987 | |
| DE | 39 35 364 | 8/1990 | |
| DE | 42 05 084 | 9/1993 | |
| DE | 44 43 980 | 6/1996 | |
| DE | 195 25 933 | 1/1997 | |
| DE | 195 41 039 | 5/1997 | |
| DE | 196 10 507 | 9/1997 | |
| DE | 196 16 424 | 10/1997 | |
| DE | 196 54 902 | 10/1997 | |
| DE | 196 34 473 | 1/1998 | |
| DE | 196 46 717 | 5/1998 | |
| DE | 196 51 566 | 6/1998 | |
| DE | 197 16 912 | 11/1998 | |
| DE | 197 41 984 | 6/1999 | |
| DE | 198 50 353 | 3/2000 | |
| DE | 199 20 593 | 11/2000 | |
| DE | 10 2004 043 747 | 3/2006 | |
| DE | 20 2005 016 382 | 3/2006 | |
| DE | 20 2007 013680 | 1/2008 | |
| EP | 0999729 | 5/2000 | |
| EP | 0947281 | 3/2002 | |
| GB | 1 593 235 | 7/1981 | |
| JP | 6-351194 A | 12/1994 | |
| WO | WO 91 16718 | 10/1991 | |
| WO | WO 95 26538 | 10/1995 | |
| WO | WO 97 30418 | 8/1997 | |
| WO | WO 97 35273 | 9/1997 | |
| WO | WO 00/21030 | 4/2000 | |
| WO | WO 00/36891 | 6/2000 | |
| WO | WO 00 68994 | 11/2000 | |
| WO | WO 2006003851 A1 * | 1/2006 | |
| WO | WO 2006 050691 | 5/2006 | |

* cited by examiner

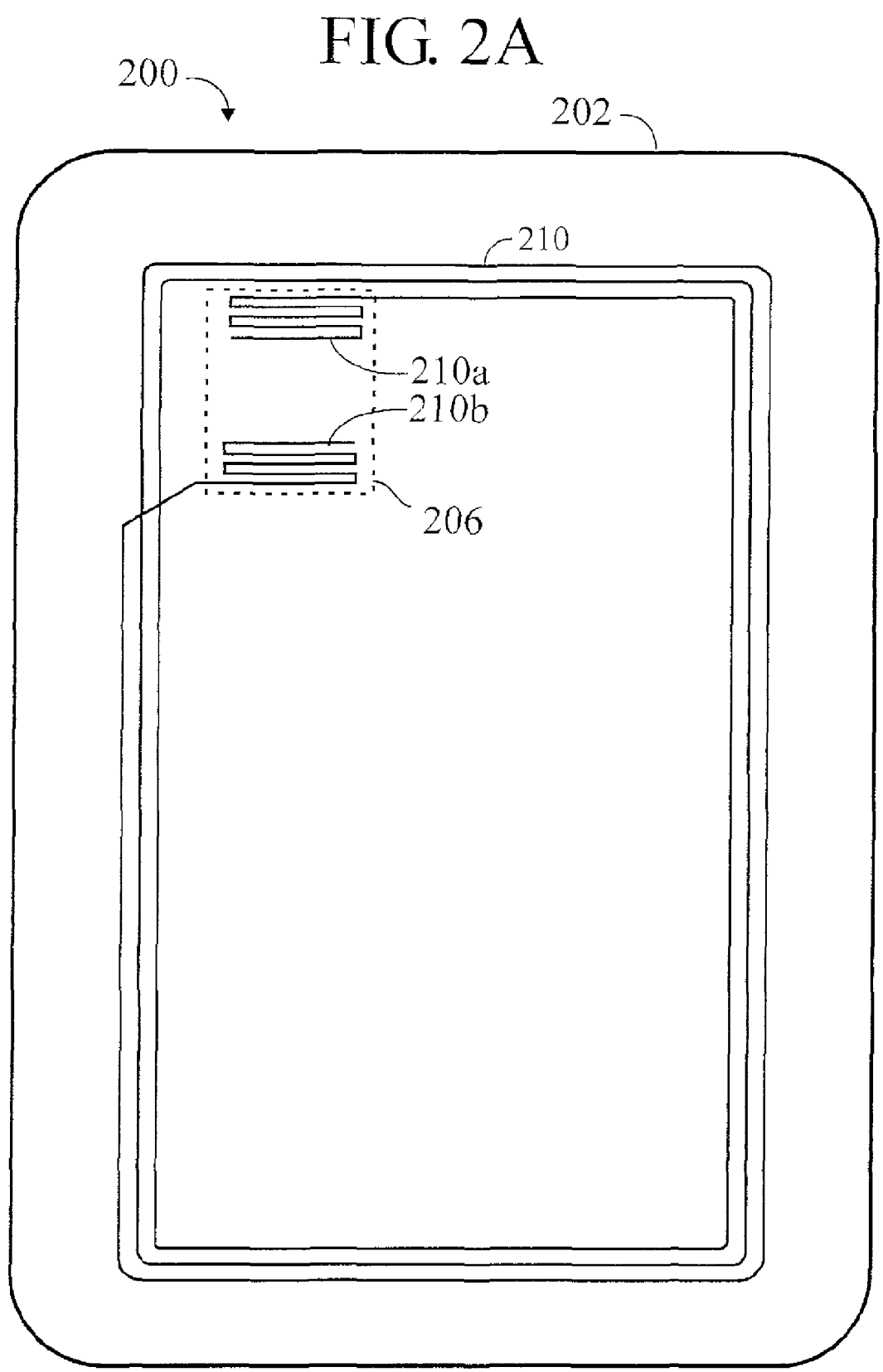

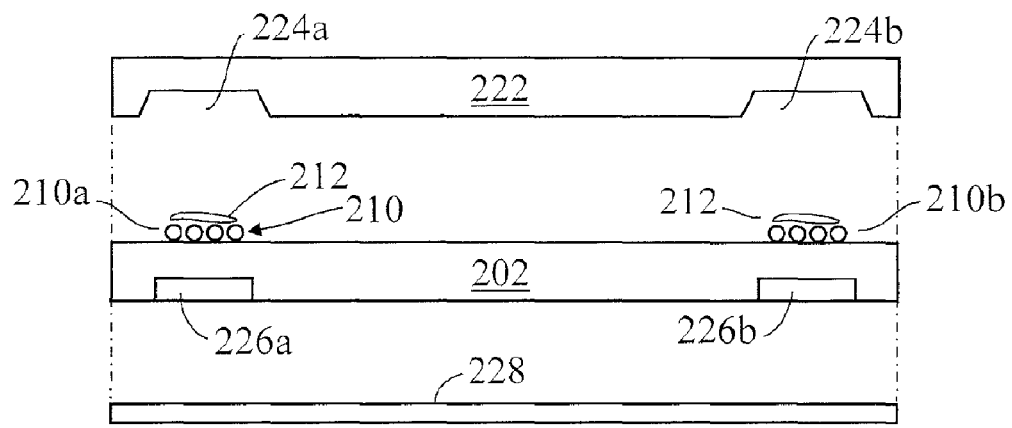
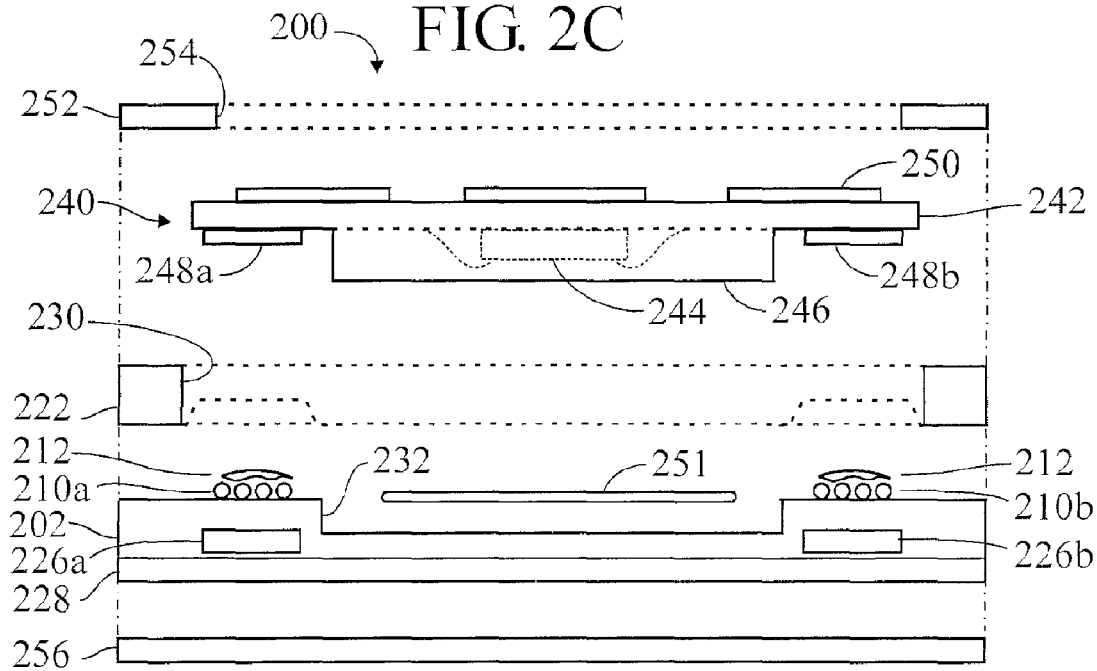

DUAL INTERFACE INLAYS

CROSS-REFERENCE TO RELATED APPLICATIONS

This patent application claims benefit of U.S. Provisional Application No. 60/938,454 filed 17 May 2007 by Finn ("S11ppa").

FIELD OF THE INVENTION

The invention relates primarily to techniques for fabricating dual interface cards comprising an antenna embedded in one substrate, and laminated with upper and lower substrates whereby a chip module is connected to the antenna prior or after final lamination.

BACKGROUND OF THE INVENTION

A conventional method to produce an inlay site containing a high frequency RFID chip and an antenna embedded into a multi-layer substrate and connected to the terminals (terminal areas) of the RFID chip is to first position the RFID chip in a recess, supported by a lower substrate layer, then start embedding (countersinking) a wire conductor onto or into the top substrate layer in the direction of the RFID chip, then guiding the wire conductor over a first terminal area of the RFID chip, then continue the embedding process by forming an antenna in the top substrate layer with a given number of turns, then guiding the wire conductor over the second terminal area, and finally embedding the wire conductor again into the top substrate layer before cutting the wire to complete the high frequency transponder site. In a next stage of the production process, the wire ends passing over the terminal areas are interconnected by means of thermal compression bonding. Adhesively placing a wire conductor onto the top substrate layer is an alternative to embedding, and typically involves self-bonding coated wire conductor.

A wire embedding apparatus may be an ultrasonic wire guide tool, known as a "sonotrode", with a wire feed channel (capillary) passing through the centre of the wire guide tool. The wire conductor is fed through the wire guide tool, emerges from the tip, and by application of pressure and ultrasonic energy the wire conductor is "rubbed" into the substrate, resulting in localized heating of the wire conductor and subsequent sinking of the wire conductor into the substrate material during the movement of the wire guide tool. A wire placement apparatus may also be an ultrasonic tool similar in function to an ultrasonic horn which heats the wire to form an adhesion with a substrate.

U.S. Pat. No. 6,698,089 ("089 patent"), incorporated by reference in its entirety herein, discloses device for bonding a wire conductor. Device for the contacting of a wire conductor in the course of the manufacture of a transponder unit arranged on a substrate and comprising a wire coil and a chip unit, wherein in a first phase the wire conductor is guided away via the terminal area or a region accepting the terminal area and is fixed on the substrate relative to the terminal area or the region assigned to the terminal area by a wire guide and a portal, and in a second phase the connection of the wire conductor to the terminal area is effected by means of a connecting instrument. FIGS. 1 and 2 of the 089 patent show a wire conductor 20 being embedded in a surface of a substrate 21, by the action of ultrasound. FIG. 3 of the 089 patent shows a wiring device 22 with an ultrasonic generator 34, suitable for embedding the wire. It is believed that the wiring device in the 089 patent can also be used for adhesively placing a wire.

An Inlay and Transponder of the Prior Art

U.S. Pat. No. 6,698,089 ("089 patent"), incorporated by reference in its entirety herein, discloses device for bonding a wire conductor. Device for the contacting of a wire conductor in the course of the manufacture of a transponder unit arranged on a substrate and comprising a wire coil and a chip unit, wherein in a first phase the wire conductor is guided away via the terminal area or a region accepting the terminal area and is fixed on the substrate relative to the terminal area or the region assigned to the terminal area by a wire guide and a portal, and in a second phase the connection of the wire conductor to the terminal area is effected by means of a connecting instrument. FIGS. 1 and 2 of the 089 patent show a wire conductor 20 being embedded in a surface of a substrate 21, by the action of ultrasound. FIG. 3 of the 089 patent shows a wiring device 22 with an ultrasonic generator 34, suitable for embedding the wire. It is believed that the wiring device in the 089 patent can also be used for adhesively placing a wire.

FIGS. 1A and 1B illustrate an inlay substrate (or sheet) 100 having a plurality of transponder areas. A selected one of the transponder areas 102 constituting a single transponder is shown in detail. The vertical and horizontal dashed lines (in FIG. 1A) are intended to indicate that there may be additional transponder areas (and corresponding additional transponders) disposed to the left and right of, as well as above and below, the transponder area 102, on the inlay sheet 100. Such a plurality of transponders may be arranged in an array on the (larger) inlay sheet. As best viewed in FIG. 1B, the inlay sheet 100 may be a multi-layer substrate 104 comprising one or more upper (top) layers 104a and one or more lower (bottom) layers 104b.

A recess 106 may be formed in (through) the upper layer 104a, at a "transponder chip site", so that a transponder chip 108 may be disposed in the recess, and supported by the lower layer 104b. The transponder chip 108 is shown having two terminals 108a and 108b on a top surface thereof. The transponder chip 108 may be a chip module, or an RFID chip.

Generally, the recess 106 is sized and shaped to accurately position the transponder chip 108, having side dimensions only slightly larger than the transponder chip 108 to allow the transponder chip 108 to be located within the recess. For example, 1. the transponder chip 108 may measure: 5.0×8.0 mm
2. the recess 106 may measure: 5.1×8.1 mm
3. the terminals 108a/b may measure: 5.0×1.45 mm
4. the wire (discussed below) may have a diameter between 80 and 112 μm One millimeter (mm) equals one thousand (1000) micrometers (μm, "micron").

In FIGS. 1A and 1B, the recess 106 may be illustrated with an exaggerated gap between its inside edges and the outside edges of the chip 108, for illustrative clarity. In reality, the gap may be only approximately 50 μm-100 μm (0.05 mm-0.1 mm).

In FIG. 1A the terminals 108a and 108b are shown reduced in size (narrower in width), for illustrative clarity. (From the dimensions given above, it is apparent that the terminals 108a and 108b can extend substantially the full width of the transponder chip 108.)

It should be understood that the transponder chip 108 is generally snugly received within the recess 106, with dimensions suitable that the chip 108 does not move around after being located within the recess 106, in anticipation of the wire ends 110a, 110b being bonded to the terminals 108a, 108b.

As noted from the exemplary dimensions set forth above, only very minor movement of the chip 108, such as a small fraction of a millimeter (such as 50 μm-100 μm) can be tolerated.

As best viewed in FIG. 1A, an antenna wire 110 is disposed on a top surface (side) of the substrate, and may be formed into a flat (generally planar) coil, having two end portions 110a and 110b.

As best viewed in FIG. 1B, the antenna wire is "mounted" to the substrate, which includes "embedding" (countersinking) the antenna wire into the surface of the substrate, or "adhesively placing" (adhesively sticking) the antenna wire on the surface of the substrate. In either case (embedding or adhesively placing), the wire typically feeds out of a capillary 116 of an ultrasonic wire guide tool (not shown). The capillary 116 is typically disposed perpendicular to the surface of the substrate 100. The capillary 116 is omitted from the view in FIG. 1A, for illustrative clarity.

The antenna wire 110 may be considered "heavy" wire (such as 80 Mm-112 μm), which requires higher bonding loads than those used for "fine" wire (such as 30 μm). Rectangular section copper ribbon (such as 60×30 μm) can be used in place of round wire.

The capillary 116 may be vibrated by an ultrasonic vibration mechanism (not shown), so that it vibrates in the vertical or longitudinal (z) direction, such as for embedding the wire in the surface of the substrate, or in a horizontal or transverse (y) direction, such as for adhesively placing the wire on the surface of the substrate. In FIG. 1B, the wire 110 is shown slightly spaced (in drawing terminology, "exploded" away) from the substrate, rather than having been embedded (countersunk) in or adhesively placed (stuck to) on the surface of the substrate.

The antenna wire 110 may be mounted in the form of a flat coil, having two ends portions 110a and 110b. The ends portions 110a and 110b of the antenna coil wire 110 are shown extending over (FIG. 1A) and may subsequently be connected, such as by thermal-compression bonding (not shown), to the terminals 108a and 108b of the transponder chip 108, respectively.

Examples of embedding a wire in a substrate, in the form of a flat coil, and a tool for performing the embedding (and a discussion of bonding), may be found in the aforementioned U.S. Pat. No. 6,698,089 (refer, for example, to FIGS. 1, 2, 4, 5, 12 and 13 of the patent). It is known that a coated, self-bonding wire will stick to a synthetic (e.g., plastic) substrate because when vibrated sufficiently to soften (make sticky) the coating and the substrate.

In FIG. 1B, the wire 110 is shown slightly spaced (in drawing terminology, "exploded" away) from the terminals 108a/b of the transponder chip 108, rather than having been bonded thereto, for illustrative clarity. In practice, this is generally the situation—namely, the end portions of the wires span (or bridge), the recess slightly above the terminals to which they will be bonded, in a subsequent step. Also illustrated in FIG. 1B is a "generic" bond head, poised to move down (see arrow) onto the wire 110b to bond it to the terminal 108b. The bond head 118 is omitted from the view in FIG. 1A, for illustrative clarity.

The interconnection process can be inner lead bonding (diamond tool), thermal compression bonding (thermode), ultrasonic bonding, laser bonding, soldering, ColdHeat soldering (Athalite) or conductive gluing.

As best viewed in FIG. 1A, in case the antenna wire 110 needs to cross over itself, such as is illustrated in the dashed-line circled area "c" of the antenna coil, it is evident that the wire should typically be an insulated wire, generally comprising a metallic core and an insulation (typically a polymer) coating. Generally, it is the polymer coating that facilitates the wire to be "adhesively placed" on (stuck to) a plastic substrate layer. (It is not always the case that the wire needs to cross over itself. See, for example, FIG. 4 of U.S. Pat. No. 6,698, 089).

In order to feed the wire conductor back and forth through the ultrasonic wire guide tool, a wire tension/push mechanism (not shown) can be used or by application of compressed air it is possible to regulate the forward and backward movement of the wire conductor by switching the air flow on and off which produces a condition similar to the Venturi effect.

By way of example, the wire conductor can be self-bonding copper wire or partially coated self bonding copper wire, enamel copper wire or partially coated enamel wire, silver coated copper wire, un-insulated wire, aluminum wire, doped copper wire or litz wire.

FIG. 1A herein resembles FIG. 5 of U.S. Pat. No. 6,698, 089 (the '089 patent), which has a similar coil antenna (50) with an initial coil region (51) and a final coil region (52) comparable to the antenna 110 with two end portions 110a and 110b described herein. In the '089 patent, the coil (50) is arranged on a substrate 55 which comprises a substrate recess (56, compare 106 herein) in the interior region (53) of the coil (50).

In FIG. 5 of the '089 patent, it can be seen that the initial and final coil regions (end portions) of the wires extend across the recess. In FIG. 6 of the '089 patent, it can be seen that the recess extends completely through the substrate. If the antenna is mounted to the substrate prior to the chip being installed in the recess (and the antenna is mounted to the front/top surface/side of the substrate, as shown), due to the fact that the antenna wires are "blocking" entry to the recess from the top/front surface of the substrate, the chip must be installed into the recess from the back (bottom) side of the substrate, as indicated by FIG. 6 of the '089 patent.

FIG. 7 of the '089 patent shows the subsequent (inter) connection of the terminal areas 59 of the chip unit 58 to the initial coil region 51 and to the final coil region 52 by means of a thermode 60 which under the influence of pressure and temperature creates a connection by material closure between the wire conductor 20 and the terminal areas 59, as an overall result of which a card module 64 is formed.

Dual Interface Card Prior Art

The conventional method to produce a dual interface card or combi-card (contactless & contact) is to embed an antenna into a substrate, form squiggles at the position under the chip module and to laminate the layers to create a pre-laminated inlay.

US patent application 20020020903 from Hans-Diedrich Kreft (assigned to Angewandte Digital Elektronik—ADE) describes a microchip card capable of operation both as a contactless card and as a contact card. Patents from ADE include U.S. Pat. No. 5,773,812 and U.S. Pat. No. 6,008,993. The U.S. Pat. Nos. 6,190,942 & 6,095,423 from Robert Wilm (assigned to PAV Card) describe a method of producing said card.

Two manufacturing methods are used to produce dual interface cards (with Contact & Contactless functionality). The first method involves embedding an antenna into a non-conductive sheet (at each site in an array) whereby the connection to the respective chip module is prepared by embedding squiggles or meanders at the position where a contact chip module will reside. The non-conductive sheet with the antennae is hot or cold laminated to an upper layer to form a pre-laminated dual interface inlay for further processing by a smart card manufacturer. At the secure printers, the pre-laminated inlay is laminated to an upper and lower printed sheet (including an anti-scratch overlay), and then each site in the array is punched to release a single card body. In the next step of the process, a cavity or recess to accommodate the contact chip module is milled out of the card body to a depth where the wire ends of the antenna (as squiggles) are positioned. The contact chip module is then bonded to the antenna using conductive glue. For the purpose of clarity, it should be emphasized that the contact chip module has contact pads on the face up side (ISO 7816 smart card) as well as on the face down side for interconnection to the antenna (Contactless e.g. ISO/IEC 14443).

The critical manufacturing process is the interconnection of the wire ends of the antenna to the chip module. Apart from yield loss during production, the life time of the finished product is difficult to guarantee with certainty, as torsion and bending of the card body at the position of the chip module results in operational failure.

An alternative conventional approach to the above method is to embed an antenna into a non-conductive sheet and to pass the wire ends of the antenna over an opening at each site in the array which can later accommodate the interconnection pads and mould mass of a contact chip module. In the next step, a contact chip module is placed onto the surface of the non-conductive sheet with the interconnection pads for connection to the antenna facing down into the opening. Then the wire ends of each antenna are connected by means of thermal compression bonding or soldering to the face down interconnection pads on the chip module.

The sheet with the array of contact chip modules connected to the underlying antennae is hot or cold laminated with a second sheet (or several sheets) to form a dual interface inlay. To protect the contact chip module from damage due to pressure during the lamination process, a removable sheet (approx. 240 micron, e.g. Teflon) equal in thickness to the protruding printed circuit board of the contact chip module, has openings to accept the chip modules.

This means that the removable sheet is flush with all the chip modules, having an even surface for lamination. In some cases, an additional sheet (release film) such as Pacothane is used to further protect the contact chip modules. After lamination, the removable sheet and the Pacothane is detached from the inlay, leaving the PCB part of the contact chip modules protruding over the surface of the inlay.

At the secure printers, the overlay sheet and the printed sheet (typically offset printing) are laminated together and openings are punched into the laminate to accommodate the chip modules on the dual interface inlay. The dual interface inlay is sandwiched between the upper and lower printed sheet laminates, and then laminated together.

Although the problem of a weak interconnection of the antenna to the contact chip module is partially resolved, there are serious problems of chip breakage during both (pre & final) lamination processes as well as the shrinkage of the materials leaving a spoiled printed sheet around the contact chip module area. To compensate for shrinkage, it is possible to match the grain direction of the materials to one another and to provide for indents in the lamination plates, but the overall yield loss is significant.

A Dual Interface Card

German printed patent document DE 39 35 364 discloses a chip card that has an electronic chip with a memory, contacts and contactless transmission means such as coils and/or condensers which are embedded in the card material and which, for purposes of supplying energy to the chip, exchange energy and bi-directional data with a terminal via the contacts or else contact-free. The chip of the chip card has an electronic circuit which generates a logical signal that, depending on the occurrence of voltage at the contacts or at a coil, is logically "high" or logically "low". As a result, the chip card is autonomously capable of deciding whether it is being addressed via the contact-coupled segment or via the contactless segment and consequently, it functions accordingly. This chip card, which is also called Dual Interface Card or CombiCard, is likewise described in the literature reference Helmut Lemme, Der Mikrorechner in der Brieftasche [The microcomputer in your wallet], Elektronik 26/1993, pp. 70-80. This chip card offers considerably greater reliability than the simple contactless cards. German printed patent document DE 44 43 980 also describes connecting the coils and the chip in a special manner.

Method for Connecting an Antenna to Chip Unit

A conventional method to produce an inlay is to embed insulated wire into a synthetic material or a coated substrate, form an antenna coil with a number of turns and interconnect the wire ends of the antenna to a transponder chip (or chip module). The interconnection of the antenna wire to the chip module is non-trivial, and it can be beneficial that the chip module can be installed on a substrate which has already been prepared with an antenna coil.

The conventional method to produce an inlay site containing a high frequency RFID chip and an antenna embedded into a multi-layer substrate and connected to the terminal areas of the RFID chip, is to embed a wire conductor into the top substrate layer in the direction of the RFID chip residing in a recess and supported by a lower substrate layer, then to guide the wire conductor over the first terminal area of the RFID chip, continue the embedding process by countersinking the wire conductor into the top substrate layer to form an antenna with a given number of turns and then guiding the wire conductor over the second terminal area and finally embedding the wire conductor again into the top substrate layer before cutting the wire to complete the high frequency transponder site. In the next stage of the production process the wire ends passing over the terminal areas are interconnected by means of thermal compression bonding.

U.S. Pat. No. 6,698,089 ("089 patent"), incorporated by reference in its entirety herein, discloses device for bonding a wire conductor. Device for the contacting of a wire conductor (113) in the course of the manufacture of a transponder unit arranged on a substrate (111) and comprising a wire coil (112) and a chip unit (115), wherein in a first phase the wire conductor (113) is guided away via the terminal area (118, 119) or a region accepting the terminal area and is fixed on the substrate (111) relative to the terminal area (118, 119) or the region assigned to the terminal area by a wire guide and a portal, and in a second phase the connection of the wire conductor (113) to the terminal area (118,119) is effected by means of a connecting instrument (125).

FIGS. 1 and 2 of the '089 patent show a wire conductor 20 being embedded in a surface of a substrate 21, by the action of ultrasound. FIG. 3 of the 089 patent shows a wiring device 22 with an ultrasonic generator 34, suitable for embedding the wire. It is believed that the wiring device in the 089 patent can also be used for adhesively placing a wire.

FIG. 4 of the '089 patent shows a wire conductor 20 on a substrate 42. The substrate 42 has a recess 45. The wire is ultrasonically embedded in the substrate. The wire is not embedded in the recess. In passing over the recess, "the ultrasonic loading of the wire conductor 20 is interrupted while the latter is being guided away via the substrate recess in the course of the wiring operation".

(column 9, lines 51-54) FIG. 5 of the 089 patent also shows a coil 50 on a substrate 55 having a recess 56. The coil 50 has an initial coil region 51 and a final coil region 52. As shown in FIG. 6 of the 089 patent, a chip unit 58 may be placed in the substrate recess 56, from a side of the substrate opposite from the coil 50, and FIG. 7 shows subsequent connection of terminal areas of the chip unit to the initial coil region 51 and to the final coil region 52 by means of a thermode 60.

FIGS. 13, 14 and 15 of the '089 patent show a wire 113 on a substrate 111 having a recess 114 to accept a chip 115. The wire has ends 116 and 117. The chip has terminals 118 and 119. The wire is embedded using an ultrasonic instrument 125. The wire is guided away via the chip 115 that is received in the recess 114. (column 13, lines 65-66) It is discussed that a single ultrasonic instrument can be used both for fixation of the wire and for connection of the wire to the terminals of the chip. (column 15, lines 33-36)

The process described above with reference to FIGS. 14 and 15 of the 089 patent also offers the possibility, by appropriate choice of the points of fixation of the wire conductor on the substrate, of guiding the wire conductor away diagonally via the terminal areas, in order to increase the overlap between the wire conductor and the terminal areas. Also, several chips or other elements arranged in series on, or in, a substrate can be connected by means of the wire conductor in the manner represented in FIG. 14. (column 14, lines 39-47). Of particular interest to the present invention are FIGS. 16 and 17 of the 089 patent.

FIGS. 16 and 17 of the 089 patent show that a chip 132 is introduced into the recess 114 after fixation of the wire conductor 113 on the surface of the substrate. Ends of the wire pass over the recess, generally in alignment with positions corresponding to terminals on the chip. After the chip is installed (FIG. 16), a connecting instrument enables a connection of the wire conductor to the corresponding terminal area. (Also, as discussed therein, in order to enable a positioning of the chip that is suitable for contacting of the wire conductor, the chip 132 is equipped on its contact side with a bridge-tape alignment aids 135, arranged adjacent to a terminal area, which provide for correct relative positioning via guide bevels 136.

Laser Soldering

Laser soldering is a technique where a ~30-50 W laser is used to melt and solder an electrical connection joint. Diode laser systems based on semiconductor junctions are used for this purpose. Wavelengths are typically 808 nm through 980 nm. The beam is delivered via an optical fiber to the workpiece, with fiber diameters 800 um and smaller. Since the beam out of the end of the fiber diverges rapidly, lenses are used to create a suitable spot size on the workpiece at a suitable working distance. A wire feeder is used to supply solder. Both lead-tin and silver-tin material can be soldered. Process recipes will differ depending on the alloy composition. For soldering 44-pin chip carriers to a board using soldering preforms, power levels were on the order of 10 Watts and solder times approximately 1 second. Low power levels can lead to incomplete wetting and the formation of voids, both of which can weaken the joint. The following patents and article are incorporated by reference herein: See also Laserunterstütztes Flip-Chip Bonden, Dr. Mani Alavi, HSG IMIT, LB000-0300, pages 1-4

European Patent EP0947281, incorporated by reference herein, discloses device and method for thermo-compression bonding. The arrangement has a wedge (10) which can be applied to a bonding point (14) and an associated optical conductor (19). The conductor is coupled to a laser light (23) source and directed towards a section of bonding wire (13) beneath the wedge between it and the bonding position. The conductor is fed through the wedge to near the bonded wire section so that only this section is heated for thermo-compression bonding when laser energy is coupled in.

European Patent EP0999729, incorporated by reference herein, process for laser soldering and for temperature monitoring of semi-conductor chips, and chip cards manufactured according to this process. A laser beam (32) heats solder (12) applied to a solder point to melting point, and interrupts the beam. The laser beam is applied to the reverse side of a packageless semiconductor chip (10) opposite the side with the solder point. Solder of at least two solder points may be heated simultaneously, or all solder points may be heated at the same time. The laser may be applied for 0.1 to 0.5 seconds, with a focus diameter of 0.1 to 2.0 mm at a power of up to about 10 W. An Independent claim for a method of ending a soldering process during laser soldering of a semiconductor chip is also included.

BRIEF DESCRIPTION (SUMMARY) OF THE INVENTION

It is a general object of an embodiment of the invention to provide improved techniques for forming inlays.

According to an embodiment of the invention, a dual interface inlay comprises: a bottom sheet; a transponder site on a top surface of the bottom sheet; an antenna wire mounted to the top surface of the bottom sheet; end portions of the antenna wire are formed with squiggles or meanders forming contact areas on opposite sides of the transponder site to provide areas of increased surface area for subsequent attachment of a chip or chip module to the antenna wire; conductive material applied to the end portions of the antenna wire; a top sheet disposed over the bottom sheet for lamination thereto; and recesses formed in a bottom surface of the top sheet, at positions corresponding to the contact area. A cavity extending through the top sheet allows a chip module to be mounted through the top sheet onto the surface of the bottom sheet, and exposes the contact areas. The antenna wire may be embedded or adhesively placed on the surface of the substrate. The antenna wire may be insulated wire, and insulation may be removed from the end portions of the antenna wire. The conductive material on the end portions of the antenna wire may comprise solder balls or flexible solder paste, or conductive glue. Silicon cushions may be disposed in the bottom sheet under the contact areas. A corresponding method is disclosed.

BRIEF DESCRIPTION OF THE DRAWINGS

Reference will be made in detail to embodiments of the disclosure, examples of which may be illustrated in the accompanying drawing figures (FIGs). The figures are intended to be illustrative, not limiting. Although the invention is generally described in the context of these embodiments, it should be understood that it is not intended to limit the invention to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

Figure 1A:
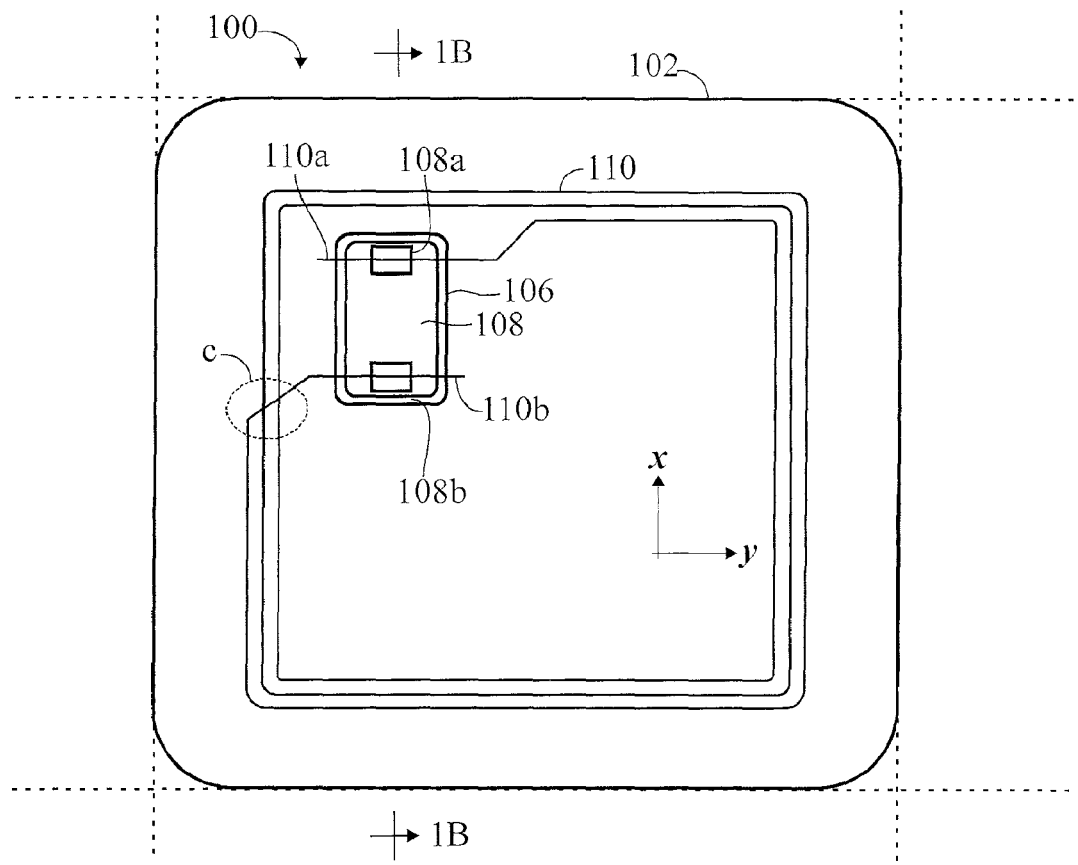

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199a, 199b, 199c, etc. Such relationships, if any, between similar elements in the same or different figures will become apparent throughout the specification, including, if applicable, in the claims and abstract.

FIG. 1A is a top view of a transponder site, according to the prior art.

Figure 1B:
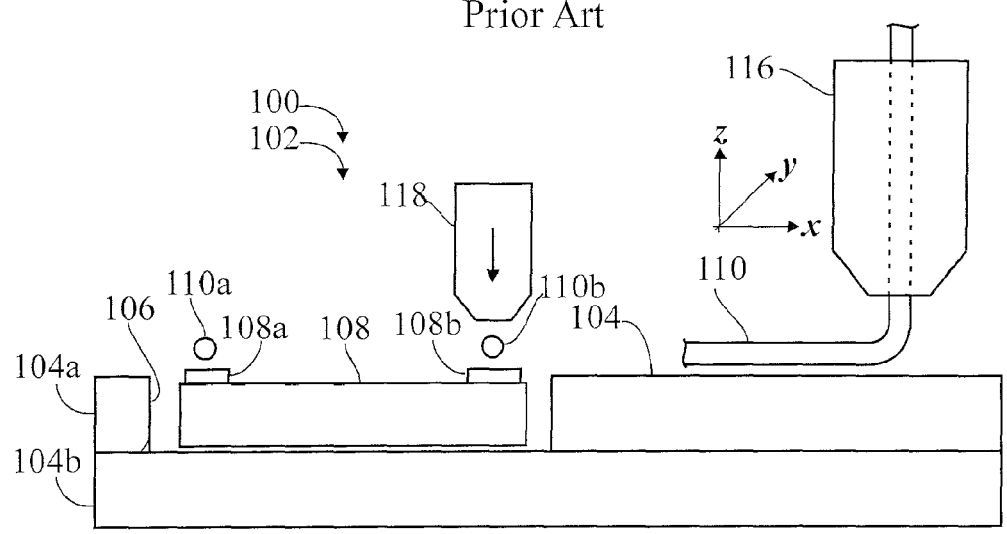

FIG. 1B is a side, cross-sectional view, partially exploded, of a wire being mounted to the substrate of FIG. 1A (and bonded to the terminals of the chip), according to the prior art.

FIG. 2A is a top view of an inlay substrate, according to an embodiment of the invention.

FIG. 2B is a cross-sectional, exploded view of the inlay substrate of FIG. 2A, with a top sheet in place, according to the invention.

FIG. 2C is a cross-sectional, exploded view of the inlay substrate of FIG. 2B, with a chip module in place, according to the invention.

Figure 2D:
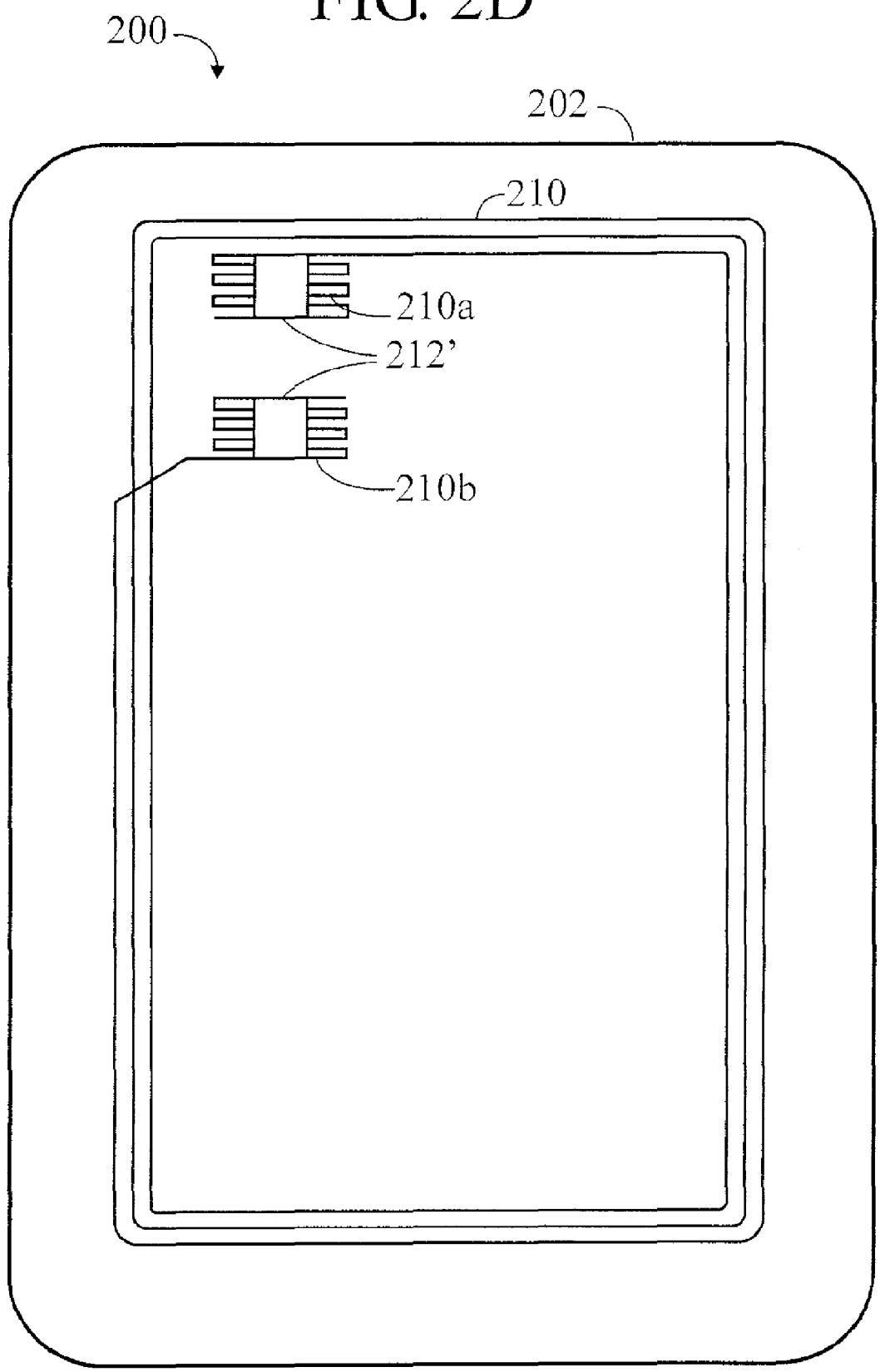

FIG. 2D is a top view of the inlay substrate of FIG. 2A, according to the invention.

Figure 2E:
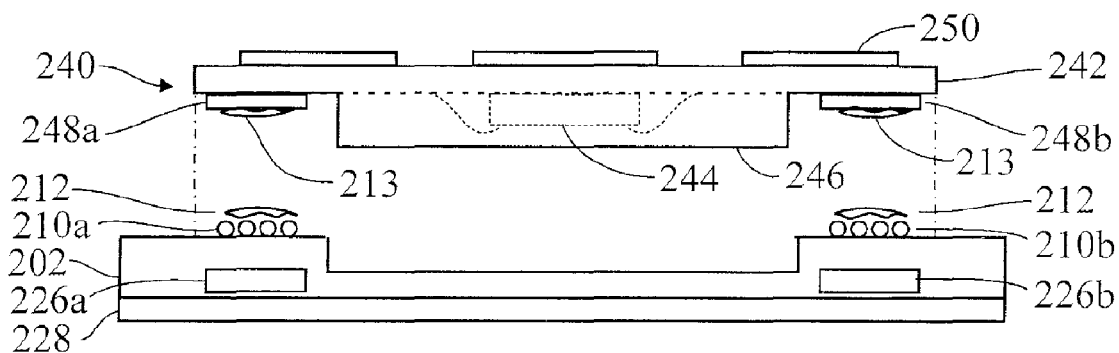

FIG. 2E is a top view of an inlay substrate such as FIG. 2A, according to the invention.

Figure 2F:
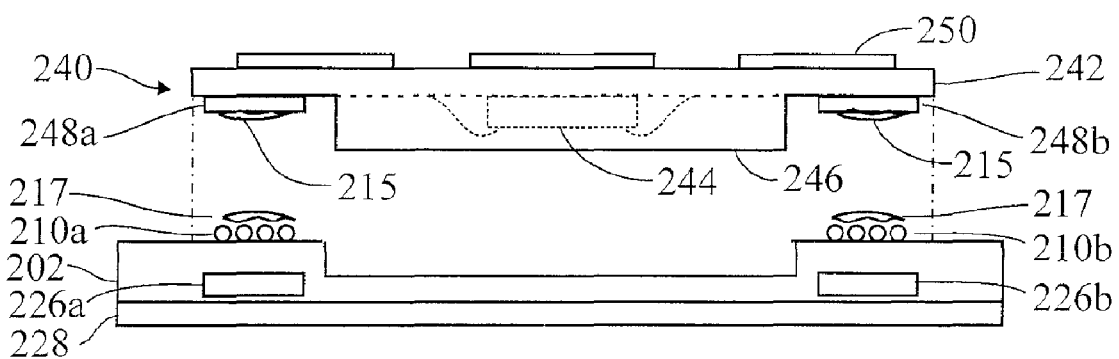

FIG. 2F is a top view of an inlay substrate such as FIG. 2A, according to the invention.

Figure 3A:
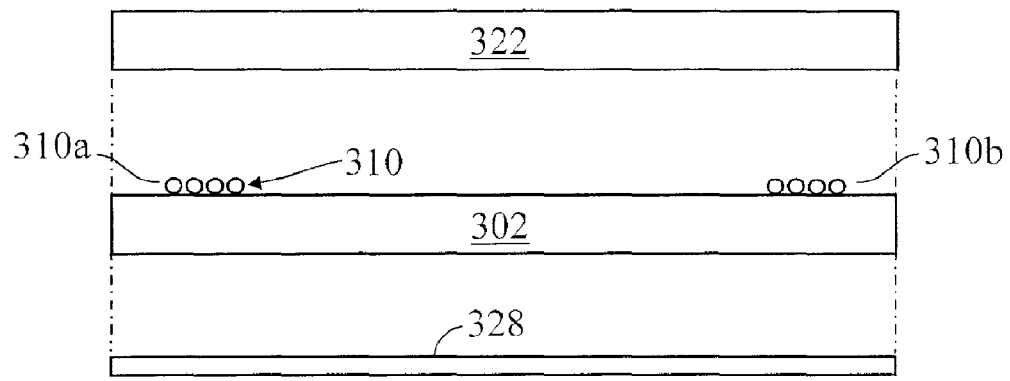
Figure 3B:
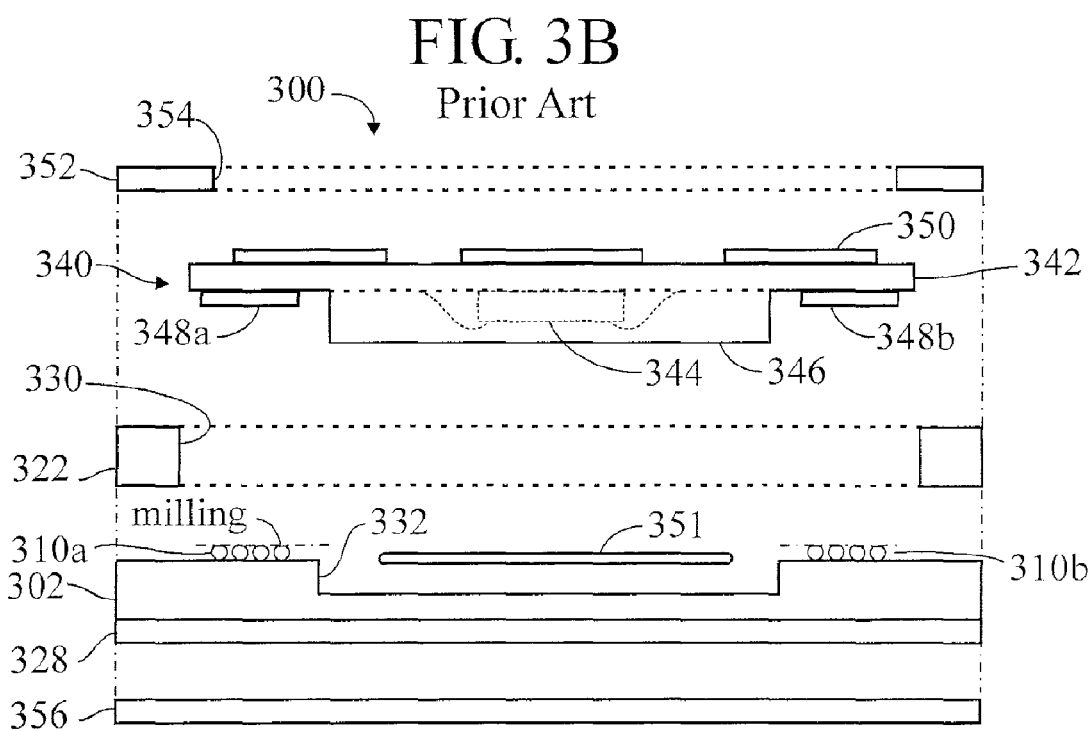

FIGS. 3A and 3B are cross-sectional exploded views of an inlay substrate, according to the prior art.

Figure 4:
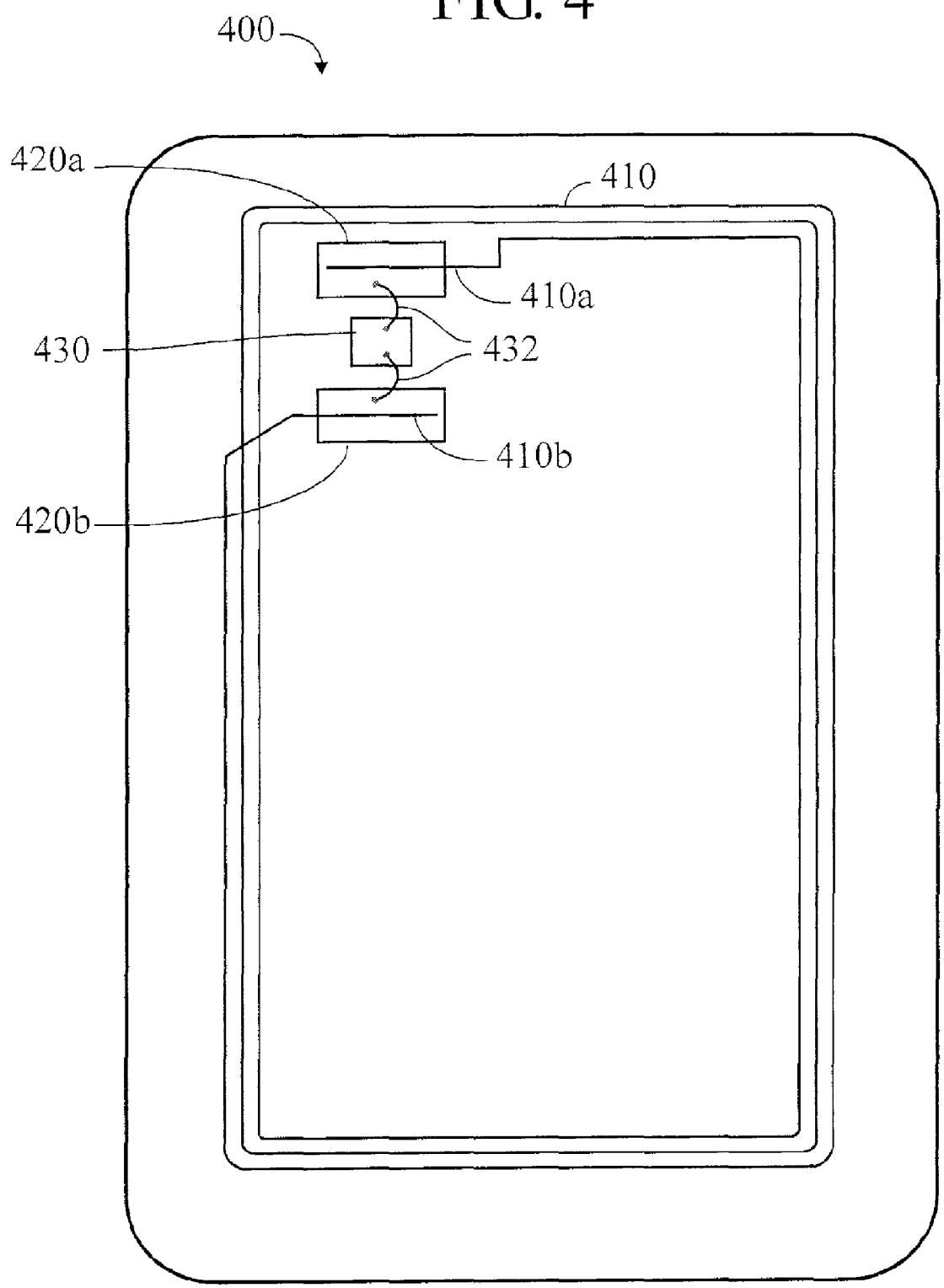

FIG. 4 is a top view of an inlay substrate, according to an embodiment of the invention.

Figure 5:
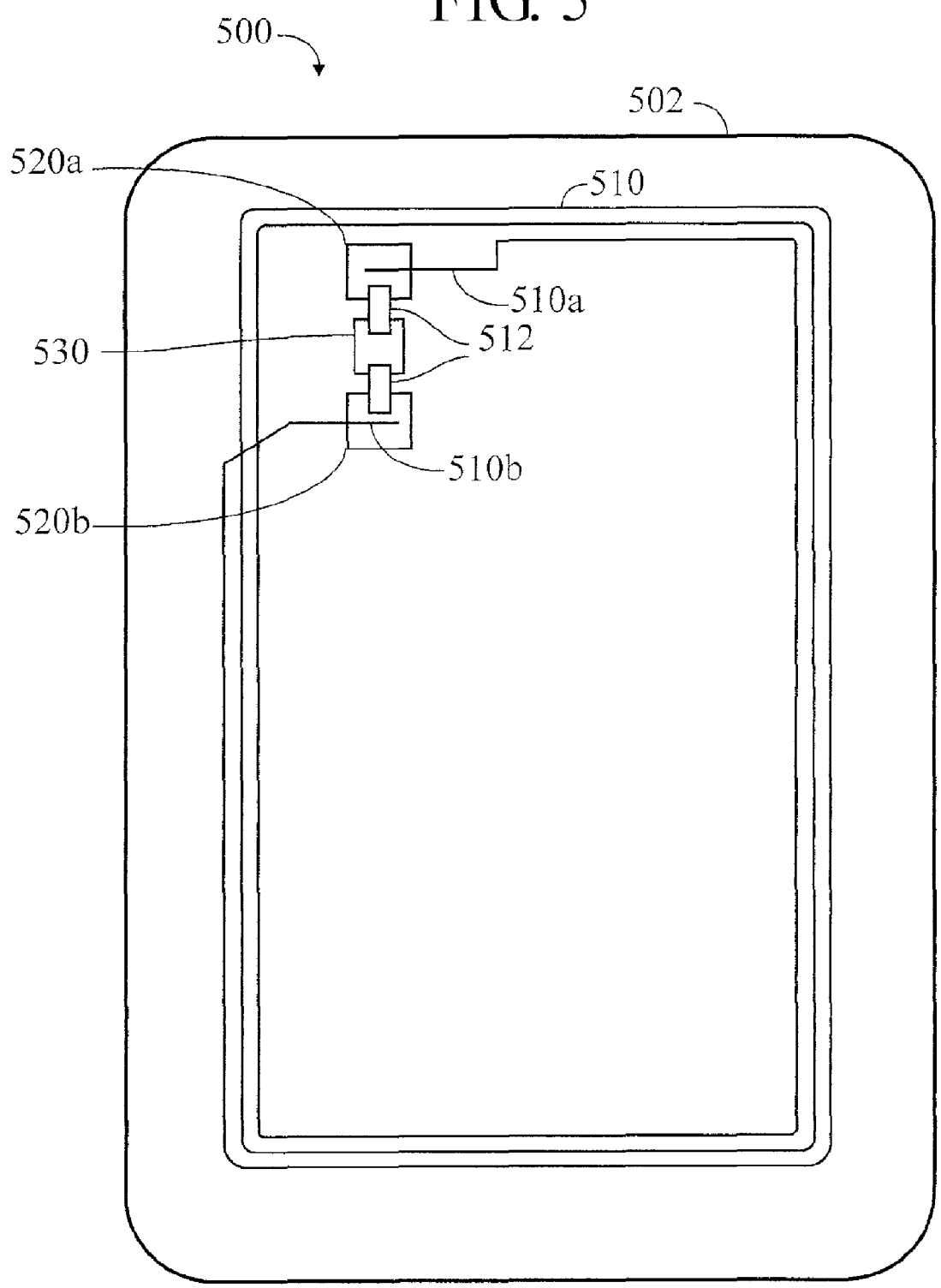

FIG. 5 is a top view of an inlay substrate, according to an embodiment of the invention.

Figure 6:
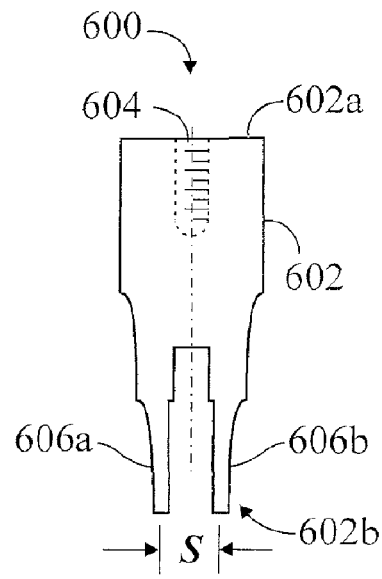

FIG. 6 is a side view of an ultrasonic head (sonotrode) to make a dual connection, according to an embodiment of the invention.

Figure 7:
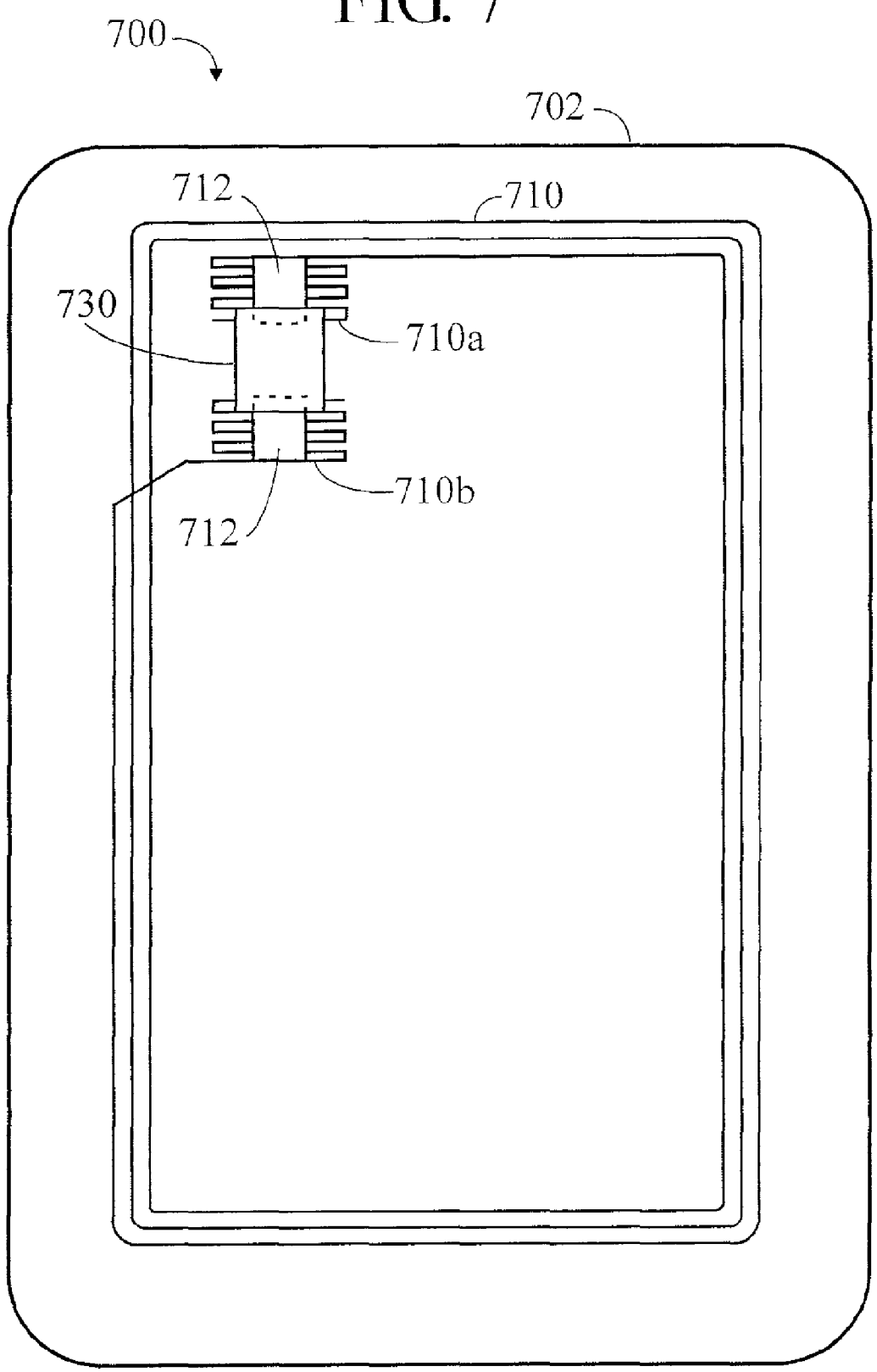

FIG. 7 is a top view of an inlay substrate, according to an embodiment of the invention.

Figure 8:
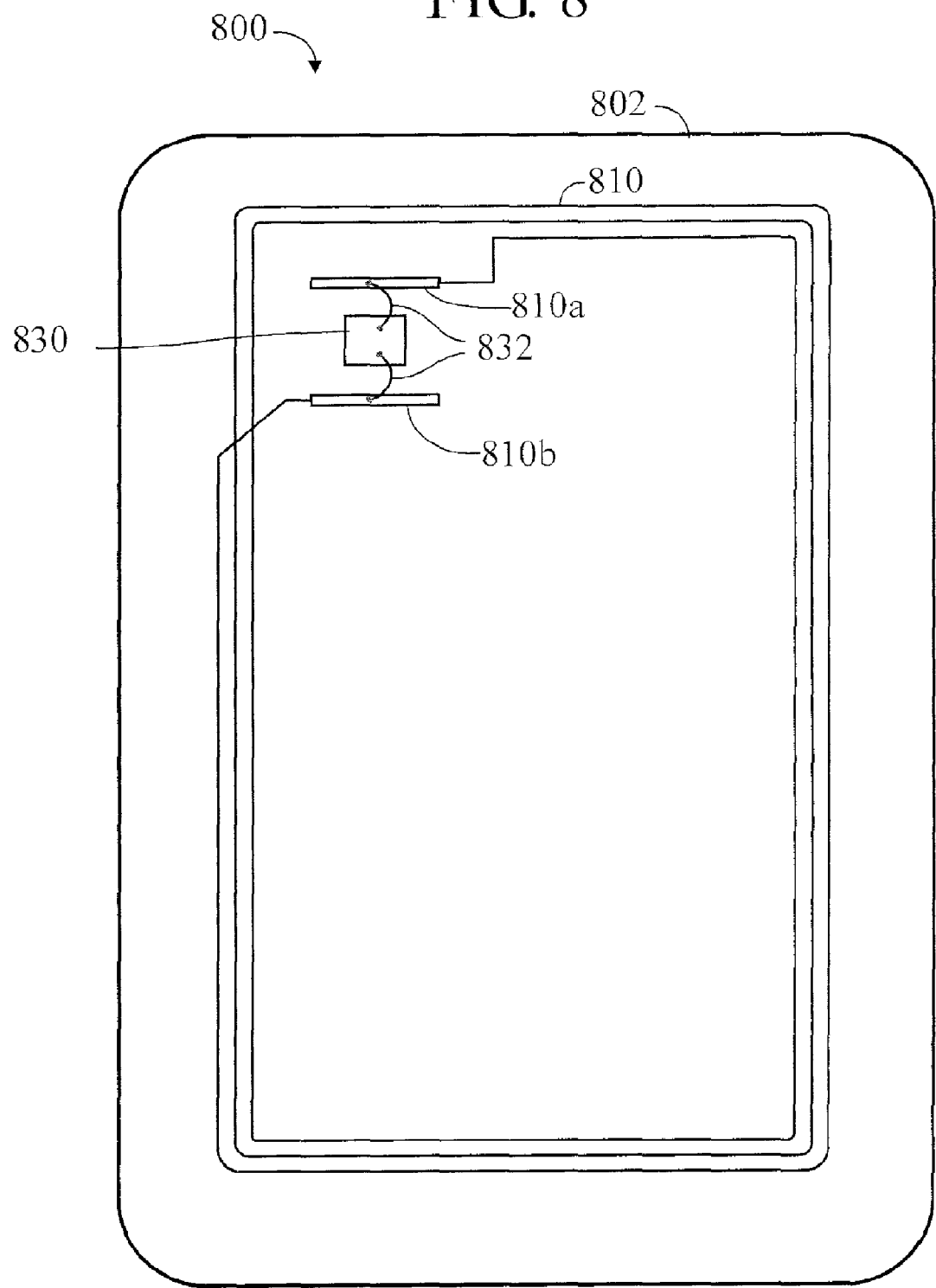

FIG. 8 is a top view of an inlay substrate, according to an embodiment of the invention.

Figure 9:
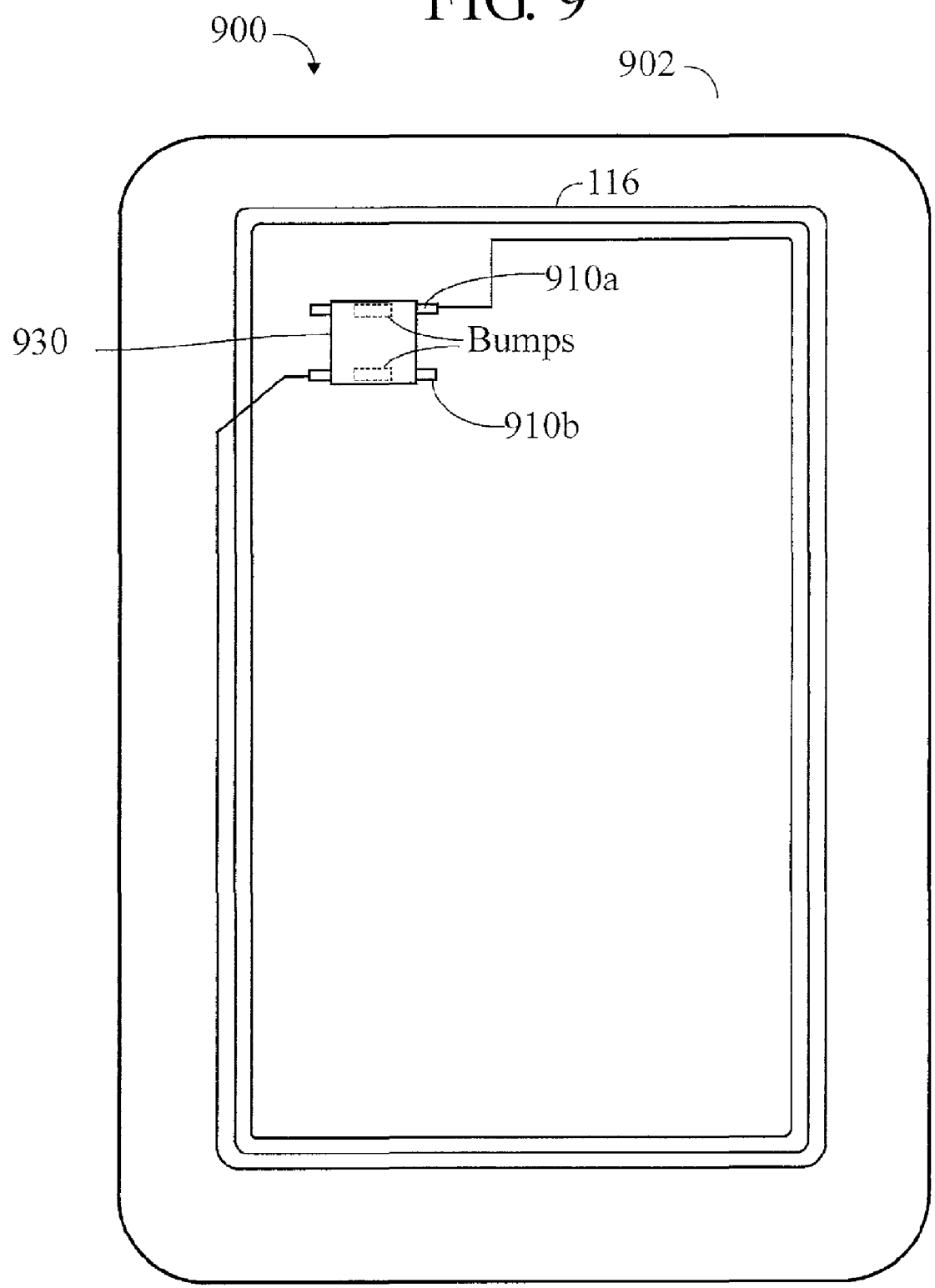

FIG. 9 is a top view of an inlay substrate, according to an embodiment of the invention.

Figure 10:
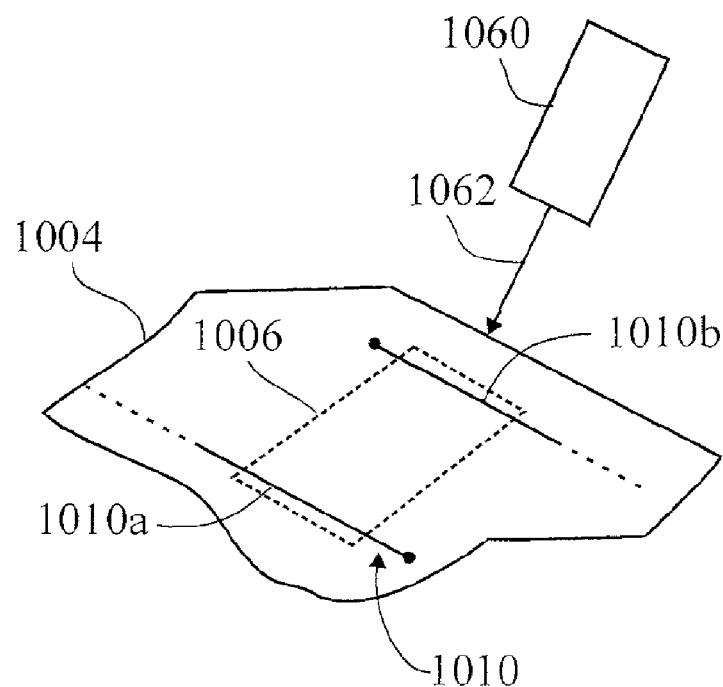

FIG. 10 is a perspective view of a technique for removing insulation from end portions of an antenna wire of an inlay, according to an embodiment of the invention.

Figure 11:
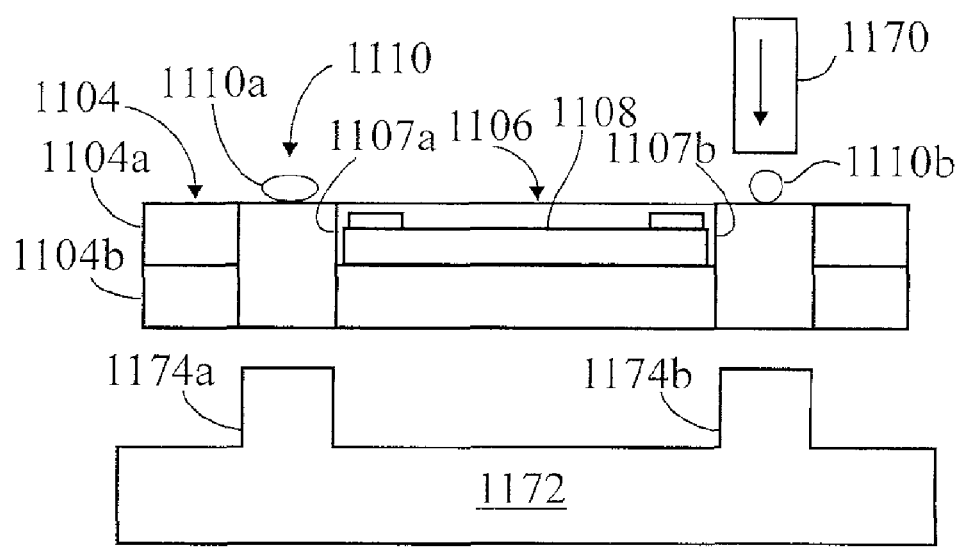

FIG. 11 is a cross-sectional view of flattening end portions of an antenna wire of an inlay, according to an embodiment of the invention.

DETAILED DESCRIPTION OF THE INVENTION

In the following description, various aspects of techniques for making dual interface cards will be described. For the purpose of explanation, specific configurations and details are set forth in order to provide a thorough understanding of the techniques. However, it will also be apparent to one skilled in the art that the techniques may be practiced without specific details being presented herein. Furthermore, well-known features may be omitted or simplified in order not to obscure the description(s) of the techniques.

Various "embodiments" of the invention will be discussed. An embodiment is an example or implementation of one or more aspects of the invention(s). Although various features of the invention may be described in the context of a single embodiment, the features may also be provided separately or in any suitable combination with one another.

It should be understood that the phraseology and terminology employed herein is not to be construed as limiting, and is for descriptive purposes only.

As used herein, an "inlay" is a generally planar substrate (or sheet), which may include several (a plurality of) distinct "transponder areas", arranged for example in a 3×6 array on the inlay sheet. The inlay sheet may have one or more (multiple) layers. A "transponder" may be fabricated in each "transponder area". Each "transponder" may include an antenna which is mounted to a surface (such as a top layer) of the substrate, and a "transponder chip" which is installed at a "transponder chip site" (or "site for the transponder chip") on the substrate. The antenna is typically in the form of a flat coil having two ends which are connected to bond pads (terminals) on the "transponder chip". The "transponder chip" may be an individual integrated circuit (IC) chip (such as a naked die or a bumped die), or a chip module (such as a flip chip, interposer, leadframe package) such as a chip mounted to a small substrate or a carrier. The "transponder chip site" of the "transponder" ("transponder area" of the "inlay sheet") may comprise a recess (or window, or opening) extending through the top and one or more underlying layers of the substrate, such that the "transponder chip" can be installed in the recess, submerged below the surface of the "inlay sheet" and supported by an underlying layer of the substrate. A window may extend completely through the inlay sheet so that a transponder chip or chip module may be installed from an opposite (from the antenna) side of the inlay sheet. The following terminology may be used herein to describe embodiments of the invention.

When the term "inlay" is used herein, it may be taken to include any generally planar substrate, typically credit-card sized, made of a synthetic material or a coated non-synthetic material, such as paper. An inlay has an array of transponder sites, the format can be 3×6 for a card manufacturer. An inlay will typically comprise a (planar) substrate, a transponder (or RFID) chip, and an antenna (typically a flat coil of wire, having two ends).

When the term "substrate" is used herein, it should be taken to include non-conductive material, synthetic material, paper but also material coated with ferrite to create a Faraday cage or material used on stealth aircraft (to absorb or reflect electromagnetic waves). The substrate may be a multi-layer substrate (such as shown in FIG. 1B).

A suitable material for any of the substrates discussed herein is TESLIN, TYVEK, PC, PVC, PE, PET, PETE, Paper, C-FLEX, Paper or Cotton/Noil etc. in sheet format or endless roll (web) can be coated with adhesive film to protect the first chip and to support the process for manufacturing the inlay at the secure printing office. The substrate can also have special markings such as luminous threads, water marks, microscopic filings and optical polymer memory for additional security. The antenna wire could be stamped with an 11 digit identification code and the inlay could have a ultra-violet strip which would break if anyone attempted to peel off a substrate layer. An LED could be incorporated into the inlay which would illuminate during data communication. A typical thickness for the substrate for passport inlays can be between 360 and 750 microns.

PVC short for polyvinyl chloride, (IUPAC Polychloroethene). PVC is a widely used thermoplastic polymer. It can be made softer and more flexible by the addition of plasticizers, the most widely used being phthalates.

PET short for Polyethylene terephthalate (also know as PET, PETE or the obsolete PETP or PET-P). PET is a thermoplastic polymer resin of the polyester family that produced by the chemical industry and is used in synthetic fibers; beverage, food and other liquid containers; thermoforming applications; and engineering resins often in combination with glass fiber. It is one of the most important raw materials used in man-made fibers.

PETE see PET.

Teslin™ Teslin is a synthetic printing media, manufactured by PPG Industries. Teslin is a waterproof synthetic material that works well with an Inkjet printer, Laser printer, or Thermal printer. Teslin is also single-layer, uncoated film, and extremely strong. In fact, the strength of the lamination peel of a Teslin sheet is 2-4 times stronger than other coated synthetic and coated papers. Teslin comes in the sizes of 7 mil to 18 ml, though only sizes 10 mil and 14 mil are sized at 8.5" by 11", for printing with most consumer printers. Also available are perforated versions of Teslin, specifically, 2up, 6up, and 8up.

Tyvek™ Tyvek is a brand of spunbonded olefin, a synthetic material made of high-density polyethylene fibers; the name is a registered trademark of the DuPont Company. The material is very strong; it is difficult to tear but can easily be cut with scissors or any other sharp object. Water vapor can pass through Tyvek, but not liquid water, so the material lends itself to a variety of applications: medical packaging, envelopes, car covers, air and water intrusion barriers (housewrap) under house siding, labels, wristbands, mycology, and graphics.

When the term "transponder" is used herein, it may be taken to include any chip suitable for use in an inlay, such as an RFID chip.

When the term "chip" is used herein, it may be taken to include a chip module, or a chip unit. Generally, as used herein, "chip" is intended to mean RFID or transponder chip. Also, where applicable, "chip" may refer to a die, chip module or carrier or "strap".

Regarding metalized bumps on chips, normally chips (also referred to as "dice", plural of "die") have aluminum pads 100×100 microns in dimension. Gold bumps may be sputtered or plated onto the aluminum pads and rise 25 microns above the pads. Enhanced pads or so-called "mega bumps" can be large and can be mounted over the active structure of a die.

When the term "wire" is used herein, it may be taken to include any elongate means for conveying or radiating signals, such as metallic wire (such as gold, aluminium, copper, silver), of any profile (such as round or rectangular), either bare, coated or colour coated, as well as optical fibers.

When the term "antenna" is used herein, it may be taken to include a simple coil antenna comprising wire having a number of turns, and two ends, a dipole antenna having two wire segments with two inner ends, or any other antenna configuration suitable for connection to a chip or chip module in an inlay.

When the term "mounting" is used herein (in conjunction with wire) it may be taken to include embedding or counter-sinking the wire into a surface of the inlay substrate and/or adhesively placing (bonding or sticking) the wire to the surface of the substrate. In some contexts, the term "embedding" may be taken to include adhesively placing, if appropriate in the context (such as when describing mounting a self-bonding wire)—in other words, "embedding" may sometimes be used to mean "mounting" (which includes both "embedding" and "adhesively placing").

When the term "bonding" is used herein, it may be taken to include any means of interconnecting (or simply "connecting"), both physically and electrically, a wire, or an end of the wire, or an end portion of the wire, to a terminal or connection pad on a chip or chip module. (Bonding typically comprises a kind of welding, but can include adhesively bonding and soldering.) The interconnection process can for example be inner lead bonding (heated diamond tool), thermal compression bonding (thermode), ultrasonic bonding or laser welding.

Generally, as used herein describing embodiments of the invention, the "transponder chip" is an electronic component comprising (having at least) two terminals, which may be a single chip, or a module comprising (having at least) a chip. Generally, the two terminals of the chip or module are interconnected with corresponding two end portions of the antenna wire which is mounted to a top surface of a substrate, which may be a multilayer substrate.

Dual Interface Inlay, Generally

The present invention of the dual interface inlay may help to resolve the unreliable interconnection between the antenna and the contact chip module as well as the chip breakage problem during lamination.

Firstly, an antenna is embedded into each site on a non-conductive sheet and squiggles or meanders are formed at the position where the face down pads of the contact chip module will reside. Secondly, the insulation of the wire conductor is removed from the squiggles using an ultra violet laser. After the laser treatment, a solder ball or flexible solder paste is applied to the un-insulated squiggles. Thirdly, recesses or indents are created in a top sheet at the position of the solder by applying ultrasonic energy to the sheet, resulting in the compression of the material, alternatively material can be removed from the top sheet mechanically or through laser ablation. Fourthly, the top sheet is placed over the lower sheet with the array of antennae sites and laminated to form a dual interface inlay.

The ends of the antenna wire form a contact area larger than the diameter of the wire due to the fact that the area of the wire squiggles or meanders, for example, is 5-10 times larger than the wire diameter. After forming one meander pattern, a second meander pattern can be formatted atop the previous meander pattern to increase the thickness of the contact area, in which case insulation should be removed from the wire prior to forming the meanders. Insulation removal can be performed while laying the wire. Or, insulation removal may be performed after laying the wire. The net result of forming the meander pattern, removing insulation and treating the surface with solder or metallizing the surface is to create enlarged planar pads for interconnecting an antenna with a contact chip module or any type of chip package including a naked die with or without bumps.

At the secure printers, the inlay is laminated to an upper and lower printed sheet (incl. an anti-scratch overlay) and then each site in the array is punched to release a single card body. In the next step of the process, a cavity or recess to accommodate the contact chip module is milled out of the card body to a depth where the solder points on the wire ends of the antenna (as squiggles) are positioned. The contact chip module is then bonded to the antenna using a hot iron to solder the module to the antenna.

In another embodiment of the invention, the area surrounding the soldered squiggles is made to float within the card body, resulting in a flexible connection to the contact chip module. This is achieved by placing silicon cushions or patches under the sheet at the position of the squiggles, which prevents the sheet material from joining with the lower layers of the inlay during lamination.

An ultraviolet (UV) laser can also be used to engrave a production code into the non-conductive substrate.

The contact chip module as described above avails of a printed circuit board for mounting of the die and an epoxy globe top to protect the wire bonds. To increase the flexibility of the contact chip module, the die can be mounted on a Kapton material with a thickness of about 30 microns. The contact pads on the face up side can be silver or gold.

The following terminology may be used throughout the descriptions set forth herein. As used herein, an "inlay" is a generally planar substrate, which may include several (a plurality of) distinct "transponder areas" (or "transponder sites"), arranged for example in a 3×6 array.

The substrate may have one or more (multiple) layers. A "transponder" may be fabricated in each "transponder area". Each "transponder" may include an antenna which is mounted to a surface (such as a top layer) of the substrate, and a "transponder chip" which is installed at a "transponder chip site" (or "site for the transponder chip") on the substrate.

The antenna is typically in the form of a flat coil having two ends which are connected to bond pads on the "transponder chip". The "transponder chip" may be an individual integrated circuit (IC) chip, or a chip module. A "transponder chip site" of the "transponder area" may comprise a recess extending through the top and one or more underlying layers of the substrate, such that when the "transponder chip" is installed in the recess, it can be supported by an underlying layer of the substrate.

A "contact chip module" refers to a standard dual interface module with ISO 7816 connections for interfacing with a mechanical reader and face down bonding pads for interconnecting with the terminal areas of an antenna sandwiched between several layers of synthetic material. A contact chip module can also refer to a leadframe, flip chip or interposer module.

A "dual interface inlay" refers to a chip card that has an electronic chip with a memory, contacts and contactless transmission means such as coils and/or condensers which are embedded in the card material and which, for purposes of supplying energy to the chip, exchange energy and bi-directional data with a terminal via the contacts or else contact-free. The chip of the chip card has an electronic circuit which generates a logical signal that, depending on the occurrence of voltage at the contacts or at a coil, is logically "high" or logically "low". As a result, the chip card is autonomously capable of deciding whether it is being addressed via the contact-coupled segment or via the contactless segment and consequently, it functions accordingly A dual interface inlay chip card is described in DE 39 35 364, incorporated by reference herein.

When the term "solder ball bonding" is used herein, it may taken to mean the placement of solder beads on the contact areas of a chip module or carrier by means of a singling-out device as described in U.S. Pat. No. 6,152,348 and connected to said contact area, for example by means of a laser.

When the term "laser bonding or welding" is used herein, it may be taken to include the interconnection of a leadframe chip module with a metalized contact surface area, whereby the laser beam is directed to the leadframe which results in localized heating and thus bonding of the metalized contact area to the leadframe. Alternatively, a minute hole can be provided in the leadframe and the laser beam is directed to the hole resulting in the bonding of the metalized contact area to the leadframe. In other words, direct or indirect bonding by means of a laser beam.

An Embodiment of a Dual Interface Inlay

FIG. 2A illustrates a dual interface inlay 200. The inlay 200 will comprise various laminated sheets, and may be in credit card format. A given inlay may be a given transponder site where a dual interface chip module will reside after completing the lamination stage with the printed graphics, and punching individual card bodies from the sheet with the array of sites.

An antenna wire 210 is "mounted" to a top (as viewed) surface of a bottom sheet (substrate) 202 which includes "embedding" (countersinking) the antenna wire into the surface of the substrate, or "adhesively placing" (adhesively sticking) the antenna wire on the surface of the substrate. The antenna may be a HF antenna with a number of turns, such as 4 or 5.

The substrate 202 may be of a synthetic material, such as PVC, in a credit card format, and may have a thickness of approximately 250 μm (microns).

End portions 210a and 210b of the antenna wire 210 are formed with squiggles or meanders to provide an area of increased surface area for subsequent attachment of a chip (or chip module) to the antenna 210. These squiggles or meanders may be considered to be "contact areas", and are generally located on opposite sides of a transponder site 206 on the surface of the bottom sheet 202 where a chip (or chip module) 240 (FIG. 2C) will be mounted. The transponder site 206 need not be, and generally is not a recess. Rather, the transponder site 206, shown in dashed lines, is merely a defined location on the substrate 202.

The antenna wire 210 may be insulated wire, and insulation from the end portions 210a and 210b of the wire may be removed, such as through laser treatment.

FIG. 2B illustrates a cross section of the dual interface inlay 200. A top sheet 222 is positioned over the bottom sheet 202, and will be laminated thereto.

The antenna wire 210 and squiggle end portions 210a and 210b of the antenna wire 210 are visible on the top (as viewed) surface of the bottom sheet 202. A dollop of conductive material 212 is applied to at least a portion of the top surfaces of the squiggles 210a and 210b. For example, solder balls or flexible solder paste, or conductive glue is applied to the un-insulated squiggle end portions 210a and 210b of the antenna wire 210. The conductive material 212 forms what may be considered to be planar pads on the squiggles 210a and 210b.

Recesses 224a and 224b may be formed in a bottom (as viewed) surface of the top sheet 222, at positions corresponding to the squiggles 210a and 210b. These recesses may be created by applying an ultrasonic stamp to the material. The recesses 224a and 224b in the top sheet 222 are for the purpose of protecting the solder area, after lamination.

The recesses 224a and 224b are larger and deeper than the squiggles 210a and 210b, so that when the top sheet 222 is laminated to the bottom sheet 202, the squiggles and solder paste will remain undisturbed. For example, a contact are formed by a squiggle may measure 4×5 mm. The antenna wire may have a thickness (diameter) of 112 microns. A recess may measure 8×10 mm, and have a depth of 125 microns.

Note that the squiggles may form a greater area than the required area for interconnection and therefore the solder balls, solder paste or conductive glue does not need to cover the entire area of the squiggles, just sufficient to make contact with the face down pads of the contact chip module. See FIG. 2D. Also, as mentioned above, a second meander pattern (second layer of squiggles) can be formatted atop the previous meander pattern to increase the thickness of the contact area.

Silicon cushions 226a and 226b may be provided in the bottom sheet 202, under the contact areas (under the squiggles 210a and 210b, respectively) so as to create partially "floating" terminal area, thus introducing flexibility of movement between the chip module and the underlying connections.

An overlay sheet 228 is disposed below the bottom sheet 202, for example to cover recesses in the bottom surface of the bottom sheet 202 into which the silicon cushions 226a and 226b may be inserted.

The top sheet 222 is laminated to the top of the bottom sheet 202. The overlay sheet 228 is laminated to the bottom of the bottom sheet 202.

FIG. 2B shows what may be considered to be an interim product (which may itself be referred to as the "inlay"), which can be shipped, later to have a chip module installed.

FIG. 2C illustrates that a cavity 230 may be milled, extending through the top sheet 222 to (i) allow a chip module 240 to be mounted through the top sheet 222 onto the bottom sheet 202, and (ii) to expose the contact areas 210a and 210ba.

Regarding the latter (ii), in this milling process, it is desired not to disturb the contact areas, only milling sufficiently to expose the recesses 224a and 224b. (At the interconnection areas, the depth of milling is to the point where the "solder platform" appears.)

Regarding the former (i), in a central area, between the contact areas 210a and 210b, milling may proceed completely through the top sheet 222 and into the bottom sheet 202, and may form a cavity (or recess) 232 in the bottom sheet for accepting the mold mass 246 of a chip module 240.

The chip module 240 may comprise:
  a substrate 242, such as 14×11 mm
  a chip 244 covered by a mold mass 246 and connected to conductive traces (not shown) on the substrate 242
  a mold mass 246 covering the chip 244
  "face-up" terminals 248a and 248b disposed on a bottom (as viewed) surface of the substrate 242 for connecting to the contact areas 210a and 210b, respectively
  "face-down" terminals 250 on the top (as viewed) surface of the substrate for making contact connections with external apparatus, such as automatic teller machines (ATM).

The chip module 240 is inserted through the top sheet 222, into (through) the cavity 230. Adhesive 251 may secure the mold mass 246 to the bottom of the milled out recess 232 in the top surface of the bottom sheet 202. A hot bond tool may be used to effect connection of the terminals 238a and 248b with the contact areas 210a and 210b, respectively.

The dual interface inlay 200 further comprises:
  an upper printed laminate (UPL) 252 disposed on the top sheet 222 with an opening 254 large enough for the face-down terminals (contacts) 250 to be exposed.
  a lower printed laminate (LPL) 256 disposed under the overlay sheet 228.

FIG. 2D illustrates the dual interface inlay 200 having an antenna wire 210 mounted (such as by embedding) to a substrate 202 formed of a synthetic material. Terminal areas 210a and 210b, also referred to as "enlarged connection areas", are formed at end portions of the wire by creating a meandering (squiggle) pattern with the wire conductor 210.

FIG. 2D is essentially the same as FIG. 2A, but with the metallization 212' (compare 212, FIG. 2B) on the squiggles 210a and 210b. This illustrates that the entire enlarged connection area (squiggle) does not need to be metalized, such as with solder.

Insulation may be removed from the end portions of the wire conductor before or after embedding. The insulation may be removed with a laser under a gas atmospheric condition so as to avoid oxidization of the wire conductor.

The "naked" (insulation removed) end portions of the wire conductor (that is, at least a portion of each enlarged connection area) may be metalled with a bondable material, such as solder (lead-tin) 312.

In this manner, a die with terminals (or bumps) may be "flip-chip" mounted to the substrate.

In addition to the conductive material 212 on the squiggles, the terminals 248a and 248b may also be provided with solder paste or balls 213 to enhance the interconnection, and a laser may be used to bond the terminal areas 248 with 212. See FIG. 2E (elements 222, 251, 252 and 256 omitted, for illustrative clarity).

A two-part (A+B) conductive adhesive system could also be used to effect the interconnection, with "part A" 215 on the terminals 248a and 248b and part "B" 217 on the squiggles 210a and 210b. See FIG. 2F (elements 222, 251, 252 and 256 omitted, for illustrative clarity).

A Prior Art Inlay

Generally, in contrast with the prior art, the dual interface inlay has:
  insulation removed from the wire by means other than milling, such as by using a laser
  silicon cushions under the contact areas in the bottom sheet
  recesses in the top sheet for capturing (without disturbing) the solder on the contact areas
  optionally solder balls attached to the terminal areas of the chip module and laser connected to the underlying contact areas of the antenna FIGS. 3A and 3B are cross-sectional exploded views of an inlay substrate, according to the prior art, and correspond approximately to FIGS. 2C and 2D to illustrate the differences.

The inlay 300 (compare 200) in its final form comprises:
  a bottom sheet 302 (compare 202)
  a transponder site (not shown, compare 206)
  an antenna wire 310 (compare 210)
  end portions 310a and 310b of the antenna wire 310 formed with squiggles
  a top sheet 322 (compare 222) laminated onto the bottom sheet 302
  an opening 230 (compare 230) is milled in the top 272
  an overlay sheet 278 is disposed below the bottom sheet 252
  an upper printed laminate (UPL) 352 (compare 252) with an opening 354 (compare 254)
  a chip module 340 (compare 240) having a mold mass 346 (compare 246) with a chip 344 (compare 244) inside, inserted through the opening in top sheet 322
  a recess 332 (compare 232) in the bottom sheet 302 for accepting the mold mass 346
  terminals 350 (compare 250) on the top of the chip module 340, and terminals 348a and 348b (compare 248a and 248b) on the bottom of the chip module 340
  adhesive 351 (compare 251) to secure the mold mass 346 to the bottom sheet 302 an upper printed laminate 352 (compare 252) with an opening 354 (compare 254) large enough for the contacts 350 to be exposed.

a lower printed laminate (LPL) 356 (compare 256)

Some specific points of difference are:

The end portions 310a/b of the antenna wire 310 are not covered with solder (compare 212).

The top sheet 322 does not have recesses (compare 224a/b) in its bottom surface.

Insulation is removed from the squiggles during the milling process (see dashed lines).

There are no silicon cushions (compare 226a and 226b) in the bottom sheet 202, under the contact areas

ALTERNATE EMBODIMENTS

FIG. 4 illustrates an inlay 400 (compare 200) which is not dual interface. The inlay 400 is contactless only (not contact).

The inlay 400 has an antenna wire 410 (compare 210) mounted (such as by embedding) to a substrate 402 (compare 202) formed of a synthetic material, such as Kapton.

Metal pads 420a and 420b are formed on a surface of the substrate 402, at a position generally corresponding to the position of the enlarged contact areas 310a/310b and 210a/210b discussed hereinabove. The metal pads 420a and 420b may be comparable (in size and location) to the enlarged contact areas 310a/310b and 210a/210b discussed hereinabove. The metal pads may be gold-plated nickel/copper.

End portions 410a and 410b of the antenna wire 410 are bonded, such as by means of thermal-compression bonding, to the metal pads 420a and 420b, respectively. A dual bonding tool is shown in FIG. 6.

An RFID chip 430 is disposed on the substrate 402 between the metal pads 420a and 420b. The chip can be silicon, inorganic or organic. The chip 430 may be connected with bond wires 432 to the metal pads 420a and 420b. After wire bonding, a mold mass (not shown) may be disposed over the chip 430, bond wires 432 and metal pads 420a/b.

This embodiment is contactless only. There are no contacts (compare 250) on the front (circuitized) face of the RFID chip 430.

In this embodiment, the inlay substrate 402 is functioning as a carrier, and no separate carrier is needed for the chip 430.

FIG. 5 illustrates an inlay 500 (compare 400) which is not dual interface. The inlay 500 is contactless only (not contact).

The inlay 500 has an antenna wire 510 (compare 410) mounted (such as by embedding) to a substrate 502 (compare 402) formed of a synthetic material, such as Kapton.

Metal pads 520a and 520b (compare 420a and 420b) are formed on a surface of the substrate 402, at a position generally corresponding to the position of the enlarged contact areas 310a/310b and 210a/210b discussed hereinabove. The metal pads 520a and 520b may be comparable (in size and location) to the metal pads 420a and 420b. The metal pads may be gold-plated nickel/copper.

End portions 510a and 510b of the antenna wire 510 are bonded, such as be thermo-compression bonding, to the metal pads 520a and 520b, respectively. A dual bonding tool is shown in FIG. 6.

A chip module 530 is disposed on the substrate 502 between the metal pads 520a and 520b.—the chip module 530 may be a leadframe, flip chip or interposer. The chip module 530 may be connected to the metal pads 520a and 520b by means of soldering, thermal compression bonding or laser welding, indicated as "532". After connecting, a mold mass (not shown) may be disposed over the chip module 530, connections 532 and metal pads 520a/b.

This embodiment is contactless only. There are no contacts (compare 250) on the front (circuitized) face of the chip module 530.

In this embodiment, the inlay substrate 502 is not functioning as a carrier, since a separate carrier (530) is provided.

Note that after the interconnection of the antenna wires with the contact areas of the metal pads or the terminal areas of a chip or chip module, the area can be sealed with silicon to ensure that moisture does not enter the bond area.

FIG. 6 illustrates an ultrasonic bonding tool (head) 600 to simultaneously interconnect the two end portions of the antenna wire to the metal pads 420a/b and 520a/b, as mentioned above. (It should be understood that the two connections could be done one at a time, without this tool.)

Generally, the bonding head 600 comprises an elongate body portion 602 having a top end 602a and a bottom end 602b. The top end 602a may have a threaded hole 604 to be mounted to an ultrasonic transducer (not shown).

The bottom end 602b may be forked, having two elongate end effectors 606a and 606b extending from the body portion 602.

A distance "S" between the two end effectors 606a and 606b may, for example, be 10-12 mm or 15-20 mm The tool 600 may be designed to operate at 60 kHz.

A wire (such as 410 or 510) being bonded using this tool 600 may, for example, be 60 micron gold wire.

FIG. 7 illustrates a dual interface inlay 700 (compare 200) having an antenna wire 710 (compare 210) mounted (such as by embedding) to a substrate 702 (compare 202) formed of a synthetic material. Terminal areas 710a and 710b (compare 210a and 210b), also referred to as "enlarged connection areas", are formed at end portions of the wire by creating a meandering (squiggle) pattern with the wire conductor 710.

FIG. 7 may be considered to be a variation on FIG. 2D, but with a bumped chip 730 placed face down on the enlarged planar pads 712 for interconnection. The method of connection can be performed by thermal compression bonding in which a hot diamond tool (450° C.) exerts pressure against the die and connections pads, to form the bonding process.

The interconnected chip 730 may be encapsulated in an epoxy medium or moulded as a package.

FIG. 8 illustrates an inlay 800 (compare 400) which is not dual interface. The inlay 800 is contactless only (not contact). FIG. 8 is essentially a variation on FIG. 4.

The inlay 800 has an antenna wire 810 (compare 410) mounted (such as by embedding) to a substrate 802 (compare 402) formed of a synthetic material, such as Kapton.

Here, the end portions 810a and 810b of the antenna wire 810 are not squiggles (such as 310a and 310b), nor are there metal pads (420a and 420b). Rather, the end portions 810a and 810b of the antenna wire 810 are prepared for an inner-lead bonding process, in which the round wire conductor is first flatten to create a rectangular wire, the insulation is removed before or after embedding and flattening and finally the wire conductor is treated under an atmospheric condition to enable an oxide free surface to be attained. The antenna wire 810 may, for example be 112 μm in diameter before flattening, and 150 μm in diameter after flattening.

In a next step, an RFID chip 830 (compare 430) may be chip is connected with bond wires 832 to the flattened end portions 810a and 810b of the antenna wire 810. After wire bonding, a mold mass (not shown) may be disposed over the chip 430, bond wires 432 and flattened end portions 810a and 810b of the antenna wire 810. (The interconnected chip 830 may be encapsulated in an epoxy medium or moulded as a package.)

FIG. 9 illustrates a dual interface inlay 900 (compare 700) having an antenna wire 910 (compare 710) mounted (such as by embedding) to a substrate 902 (compare 702) formed of a synthetic material.

In a manner similar to FIG. 8, end portions 910a and 910b (compare 810a and 810b) of the antenna wire 910 (compare 810) are prepared for an inner-lead bonding process, in which the round wire conductor is first flatten to create a rectangular wire, the insulation is removed before or after embedding and flattening and finally the wire conductor is treated under an atmospheric condition to enable an oxide free surface to be attained. The antenna wire 910 may, for example be 112 μm in diameter before flattening, and 150 μm in diameter after flattening.

FIG. 9 may be considered to be essentially a variation on FIG. 7, but with the bumped chip 930 (compare 730) placed face down flattened end portions of the antenna wire 910 rather than (squiggles and conductive mass 712) for interconnection. The method of connection can be performed by thermal compression bonding in which a hot diamond tool (450° C.) exerts pressure against the die and connections pads, to form the bonding process.

The interconnected chip 930 may be encapsulated in an epoxy medium or moulded as a package.

Note that in the case of bonding naked dice or bumped dice, a hot plate can be used to heat the dice before wire bonding or inner-lead bonding.

Removal of Insulation from End Portions of the Wire

An antenna wire (such as 210, 310, 410, 510, 710, 810, 910) is usually an insulated wire, having one or more coatings to assist (for example) in mounting by adhesively placing the antenna wire on the substrate, the coating(s) (self bonding coat and insulation layer) should be removed prior to bonding. Removal of the coating(s) (insulation) from an insulated wire (importantly from end portions of the wire that will be bonded to the terminal(s) of the transponder chip) are discussed in greater detail hereinbelow (and may involve using apparatus such as a laser or a hot iron to remove the coating (s)), and can be done (performed) either during mounting the antenna wire, or after having mounted the antenna wire such as over slots through the substrate. A mirrored surface under the slots can also be used, in conjunction with a vision system, to ensure that the insulation is completely removed.

FIG. 10 illustrates a technique for removing insulation from wire bridges, according to an aspect of the invention. This example of removing insulation is in the context of a transponder inlay such as in FIG. 1, but the principle is analogous to what may be used for the dual interface inlays described herein.

A substrate 1002 has a recess 1006 (compare 106), which may include slots (1007a, 1007b). (In this example, the recess 1006 is rectangular, for illustrative purposes.) End portions 100a and 100b (compare 110a and 110b) of an antenna wire 1010, which are "wire bridges", span the recess 1006 (or slots). Prior to installing a chip (not shown, see 108) into the recess 1906, a laser 1060 (such as a UV laser) may be used to direct a beam of light 1062 at the wire bridges 1010a and 1010b, to remove any insulating material (coating, such as enamel) therefrom, to enhance subsequent bonding to terminals of the chip, as discussed hereinabove.

In the context of a dual interface inlay, comparable slots or openings can be made in the substrate under the end portions of the antenna wire to accommodate laser removal of insulation.

It may be advantageous to use an ultra-violet (UV) laser to remove the insulation. The UV laser uses optical directing systems to remove the insulation, and the wire can be flooded (or protected by) with an inert gas, such as nitrogen, to avoid oxidation of the bare (such as copper) wire.

Flattening the End Portions of the Antenna Wire

An antenna wire is typically round in cross-section. The wire can be flattened, as described above (FIG. 8 and FIG. 9).

FIG. 11 illustrates a technique for flattening end portions of an antenna wire, according to an aspect of the invention. This example of flattening end portions of an antenna wire is in the context of a transponder inlay such as in FIG. 1, but the principle is analogous to what may be used for the dual interface inlays described herein.

Slots extending all the way through the substrate provide an opportunity to flatten the otherwise round cross-section wire, before bonding the wire to the terminals of the transponder chip (or chip module). This can be accomplished with the substrate on a workplate (anvil), and impacting the wire from above with a punch.

FIG. 11 illustrates a technique for shaping (flattening) the wire, in preparation for bonding. A substrate 1104 (compare 104) has a recess 1106 (compare 106) extending through upper layers 1104a (compare 104a) thereof, and slots 1107a and 107b extending from opposite side edges of the recess 1106 completely through the substrate 1104, including bottom layers 1104b (compare 104b) thereof. End portions 1110a and 1110b (compare 110a and 110b) of an antenna wire 1110 (compare 110) extend as "wire bridges" across the slots 1107a and 1107b.

Before installing a chip 1108 (compare 108) in the recess 1106, a punch 1170 is brought down on the wire bridges 110a and 110b to flatten out the wire from its initial circular cross-section to a flatter cross-section. To facilitate this shaping, the substrate may be disposed on a surface 1172 functioning as an anvil, having raised portions 1174a and 1174b which fit up into the slots 1107a and 1107b so that the wire does not break when shaping it.

This shaping (flattening) step can be done before or after the step of removing insulation from the wire bridges. In this figure, the wire bridge 1110a is shown as having already been flattened, and the wire bridge 1110b is in the process of being flattened.

In the context of a dual interface inlay, comparable slots or openings can be made in the substrate under the end portions of the antenna wire to accommodate flattening of the wire.

While the invention has been described with respect to a limited number of embodiments, these should not be construed as limitations on the scope of the invention, but rather as examples of some of the embodiments. Those skilled in the art may envision other possible variations, modifications, and implementations that are also within the scope of the invention, based on the disclosure(s) set forth herein.

What is claimed is:

1. A dual interface inlay comprising:
   a bottom sheet;
   a transponder site on a top surface of the bottom sheet;
   an antenna wire mounted to the top surface of the bottom sheet;
   end portions of the antenna wire are formed with squiggles or meanders forming contact areas on opposite sides of the transponder site to provide areas of increased surface area for subsequent attachment of a chip or chip module to the antenna wire;
   conductive material applied to the end portions of the antenna wire;
   a top sheet disposed over the bottom sheet for lamination thereto; and
   recesses formed in a bottom surface of the top sheet, at positions corresponding to the contact areas;

further comprising:

silicon cushions disposed in the bottom sheet under the contact areas.

2. The inlay of claim 1, further comprising:

a cavity extending through the top sheet to (i) allow a chip module to be mounted through the top sheet onto the surface of the bottom sheet, and (ii) to expose the contact areas (210*a*/b).

3. The inlay of claim 1, wherein:

the antenna wire is embedded or adhesively placed on the surface of the substrate.

4. The inlay of claim 1, wherein:

the bottom sheet comprises a synthetic material in a credit card format.

5. The inlay of claim 4, wherein:

the synthetic material comprises PVC (polyvinyl chloride).

6. The inlay of claim 1, wherein:

the antenna wire is insulated wire, and insulation is removed from the end portions of the antenna wire.

7. The inlay of claim 1, wherein:

the conductive material on the end portions of the antenna wire comprises solder balls or flexible solder paste, or conductive glue.

8. The inlay of claim 1, further comprising:

an overlay sheet disposed below the bottom sheet.

9. The inlay of claim 8, further comprising:

a lower printed laminate disposed under the overlay sheet.

10. The inlay of claim 1, wherein:

the chip module comprises:

a substrate;

a chip covered by a mold mass and connected to conductive traces on the substrate;

"face-up" terminals disposed on a bottom surface of the substrate for connecting to the contact areas, respectively; and "face-down" terminals on a top surface of the substrate for making contact connections with an external apparatus.

11. The inlay of claim 10, further comprising:

a recess in the top surface of the bottom sheet for accepting the mold mass.

12. The inlay of claim 10, further comprising:

solder paste or balls disposed on the face-up terminals.

13. The inlay of claim 10, further comprising:

part A of a two-part conductive adhesive system disposed on the face-up terminals; and part B of the two-part conductive adhesive system disposed on the contact areas.

14. The inlay of claim 10, further comprising:

an upper printed laminate disposed on the top sheet with an opening large enough for the face-down terminals to be exposed.

15. The inlay of claim 10, further comprising:

adhesive for securing the mold mass to the bottom sheet.

16. The inlay of claim 10, wherein:

the external apparatus comprises an automatic teller machine (ATM).

17. A method of making a dual interface interlay comprising:

mounting an antenna wire to a bottom sheet;

forming end portions of the antenna wire with squiggles or meanders to provide contact areas of increased surface area for subsequent attachment of a chip or chip module to the antenna wire;

applying conductive material to the end portions of the antenna wire;

disposing a top sheet over the bottom sheet for lamination thereto; and forming recesses in a bottom surface of the top sheet, at positions corresponding to the contact areas;

further comprising:

providing silicon cushions in the bottom sheet under the contact areas.

18. The method of claim 17, wherein the antenna wire is insulated wire, further comprising:

removing insulation from the end portions of the antenna wire.

19. The method of claim 17, wherein:

the conductive material on the end portions of the antenna wire comprises solder balls or flexible solder paste, or conductive glue.

20. The method of claim 17, further comprising:

providing a cavity extending through the top sheet; and mounting a chip module through the top sheet onto the bottom sheet.

* * * * *